(12) United States Patent
Lin et al.

(10) Patent No.: US 11,335,598 B2
(45) Date of Patent: May 17, 2022

(54) GRATING REPLICATION USING HELMETS AND TOPOGRAPHICALLY-SELECTIVE DEPOSITION

(71) Applicant: Intel Corporation, Santa Clara, CA (US)

(72) Inventors: Kevin Lin, Beaverton, OR (US); Sudipto Naskar, Portland, OR (US); Manish Chandhok, Beaverton, OR (US); Miriam Reshotko, Portland, OR (US); Rami Hourani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 810 days.

(21) Appl. No.: 16/024,692

(22) Filed: Jun. 29, 2018

(65) Prior Publication Data

US 2020/0006138 A1    Jan. 2, 2020

(51) Int. Cl.
| | |
|---|---|
| *H01L 21/768* | (2006.01) |
| *H01L 21/02* | (2006.01) |
| *H01L 23/528* | (2006.01) |
| *H01L 21/311* | (2006.01) |
| *H01L 23/522* | (2006.01) |
| *H01L 21/033* | (2006.01) |

(52) U.S. Cl.
CPC .... *H01L 21/76897* (2013.01); *H01L 21/0228* (2013.01); *H01L 21/0337* (2013.01); *H01L 21/31144* (2013.01); *H01L 21/76834* (2013.01); *H01L 23/528* (2013.01); *H01L 23/5226* (2013.01)

(58) Field of Classification Search
CPC ........... H01L 21/76897; H01L 21/0228; H01L 21/033; H01L 21/31144; H01L 21/76834; H01L 23/5226; H01L 23/528
See application file for complete search history.

(56) References Cited

U.S. PATENT DOCUMENTS

| | | | | |
|---|---|---|---|---|
| 6,034,427 A | * | 3/2000 | Lan | H01L 23/3128 257/698 |
| 2009/0166881 A1 | * | 7/2009 | Balakrishnan | H01L 23/53295 257/774 |
| 2016/0099196 A1 | * | 4/2016 | Yu | H01L 23/481 257/621 |

* cited by examiner

*Primary Examiner* — Telly D Green
*Assistant Examiner* — Andre C Stevenson
(74) *Attorney, Agent, or Firm* — Schwabe, Williamson & Wyatt, P.C.

(57) ABSTRACT

Embodiments include an interconnect structure and methods of forming such an interconnect structure. In an embodiment, the interconnect structure comprises a first interlayer dielectric (ILD) and a first interconnect layer with a plurality of first conductive traces partially embedded in the first ILD. In an embodiment, an etch stop layer is formed over surfaces of the first ILD and sidewall surfaces of the first conductive traces. In an embodiment, the interconnect structure further comprises a second interconnect layer that includes a plurality of second conductive traces. In an embodiment, a via between the first interconnect layer and the second interconnect layer may be self-aligned with the first interconnect layer.

10 Claims, 19 Drawing Sheets

GRATING REPLICATION USING HELMETS AND TOPOGRAPHICALLY-SELECTIVE DEPOSITION

TECHNICAL FIELD

Embodiments of the disclosure are in the field of semiconductor structures and processing and, in particular, to self-aligned features formed with topographically-selective deposition.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

In a first aspect, integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In current technologies, design rules are needed in order to account for variability in the patterning process (e.g., overlay error). For example, edge placement error (EPE) of vias may result in undesirable shorting between conductive traces when design rules are not followed. Accordingly design rules may require that a via be formed be at least 5 nm from the edge of a conductive trace and as much as 50 nm or more from the edge of a conductive trace.

Some technologies allow for reducing or eliminating the overlay errors by relying on self-aligned technologies. For example, directed self-assembly (DSA) may be used to replicate a pattern between interconnect layers. However, DSA technologies have their own limitations. One such limitation is that the pitch and width of features in a DSA replicated pattern are limited. For example, each layer may only include a single pitch and a single feature width.

DESCRIPTION OF THE EMBODIMENTS

Figure 1A:
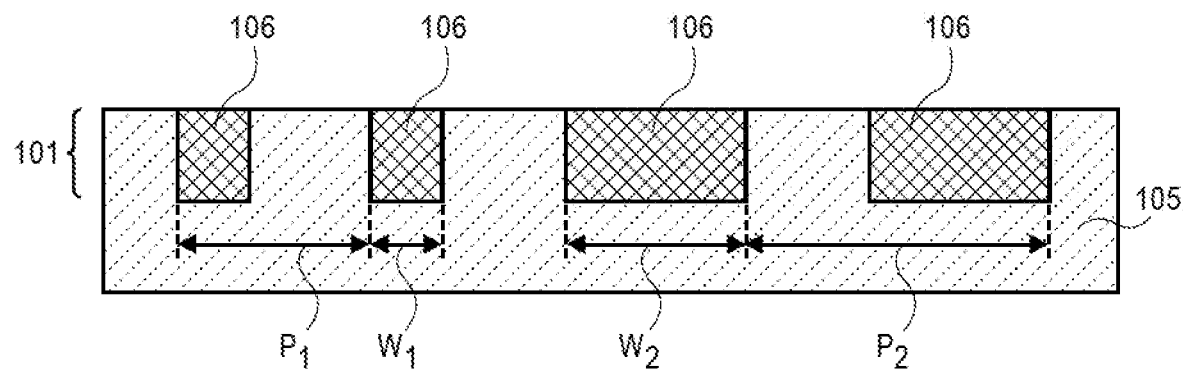
FIG. 1A is a cross-sectional illustration of a first interconnect layer that comprises a plurality of first conductive traces embedded in a first interlayer dielectric (ILD), in accordance with an embodiment.

Self-aligned gratings in microelectronic structures formed with topographically-selective deposition processes are described in accordance with embodiments. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, currently used patterning technologies do not have the flexibility to accommodate interconnect designs that include conductive traces that have more than one pitch and/or different feature widths. Accordingly, embodiments include a process for replicating gratings in subsequent layers where the grating may include two or more different pitches and/or different feature widths. Particularly, the grating is replicated by using a selectively deposited helmet layer. In an embodiment, the helmet layer is selectively deposited with a selective atomic layer deposition (ALD) process that is enabled by topographical differences in a surface. In an embodiment, a first surface may be recessed relative to a second surface. When the substrate comprising the first surface and the second surface is spun during the ALD process, the reacting species are starved from the first surface and, therefore, results in the selective deposition on the second surface. The helmet layer may then be leveraged as a mask layer in order to transfer a grating pattern to a subsequent layer.

Referring now to FIG. 1A, a cross-sectional illustration of a first interconnect layer 101 formed in a first interlayer dielectric (ILD) 105 is shown, in accordance with an embodiment. In an embodiment, the first interconnect layer 101 may comprise a plurality of conductive traces 106. In an embodiment, the plurality of conductive traces 106 may be arranged in a grating pattern. In an embodiment, the grating pattern may include conductive traces 106 that are spaced at a non-uniform pitch. For example, the grating pattern of the first interconnect layer 101 may comprise a first pitch $P_1$ and a second pitch $P_2$. While a first pitch $P_1$ and a second pitch $P_2$ are shown in FIG. 1A, it is to be appreciated that the first interconnect layer 101 may comprise a uniform pitch (i.e., a single pitch) or two or more different pitches. In an embodiment, the first interconnect layer 101 may also comprise conductive traces 106 that have a non-uniform width. For example, the conductive traces 106 in FIG. 1A are illustrated as having either a first width $W_1$ or a second width $W_2$. While a first width $W_1$ and a second width $W_2$ are shown in FIG. 1A, it is to be appreciated that the first interconnect layer 101 may comprise conductive traces 106 with a uniform width (i.e., a single width) or two or more different widths.

In an embodiment, the first interconnect layer 101 may be a first interconnect layer over a semiconducting device. For example, one or more of the first conductive traces 106 of the first interconnect layer 101 may be electrically coupled to devices on an underlying semiconducting substrate (not shown) by a via. In additional embodiments, the first interconnect layer 101 may be an intermediate layer of a plurality of interconnect layers. In such embodiments, one or more of the conductive traces 106 of the first interconnect layer 101 may be electrically coupled to underlying conductive traces by one or more vias.

Figure 1B:
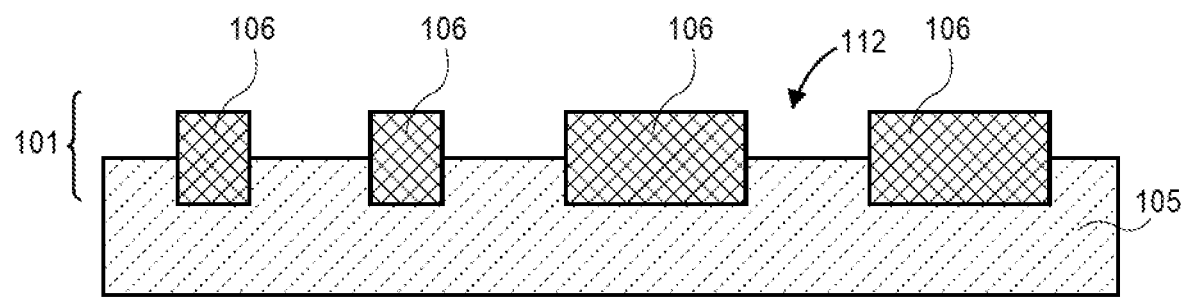
FIG. 1B is a cross-sectional illustration after the first ILD is recessed to form a topographical difference between the plurality of first conductive traces and the first ILD, in accordance with an embodiment.

Referring now to FIG. 1B, a cross-sectional illustration after the first ILD 105 is recessed is shown, in accordance with an embodiment. In an embodiment, the first ILD 105 may be recessed so that an uppermost surface of the first ILD 105 is below an uppermost surface of the first conductive traces 106. Recessing the first ILD 105 results in the formation of a trench 112 between each of the first conductive traces 106. In an embodiment, the first ILD 105 may be recessed 20 nm or greater. In an embodiment, the first ILD 105 may be recessed with an etching process, such as a wet or dry etching process, as is known in the art.

Figure 1C:
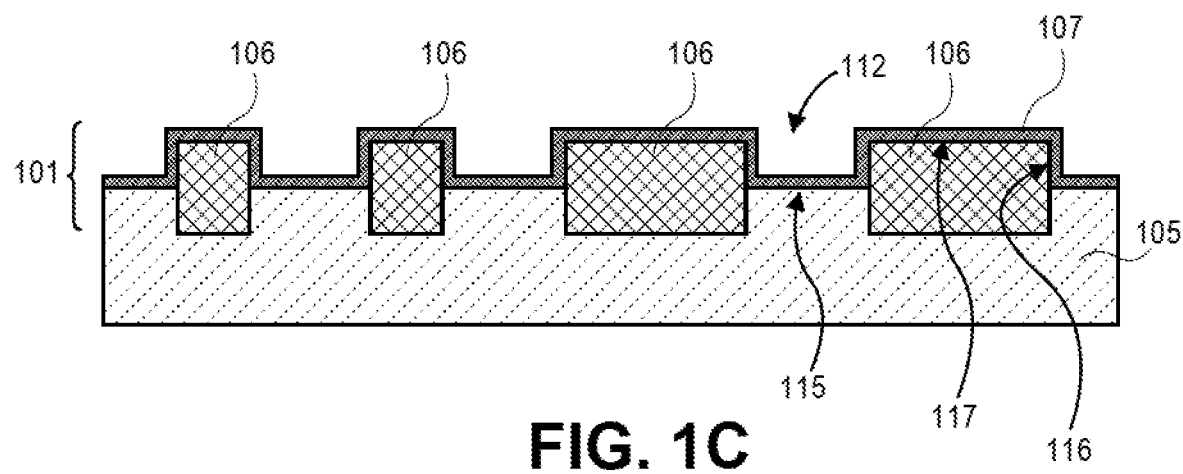
FIG. 1C is a cross-sectional illustration after an etch stop layer is formed over the first conductive traces and the first ILD, in accordance with an embodiment.

Referring now to FIG. 1C, a cross-sectional illustration after an etch stop layer 107 is formed over the exposed surfaces of the first interconnect layer 101. In an embodiment, the etch stop layer 107 may be formed on the surface 115 of the first ILD 105 at the bottom of each trench 112. Embodiments may also include portions of the etch stop layer 107 being formed along exposed sidewall surfaces 116 of the first conductive traces 106 exposed by recessing the first ILD 105, and over the uppermost surfaces 117 of the first conductive traces 106. In an embodiment, the etch stop layer 107 may be any suitable material, as is known in the art. In an embodiment, the etch stop layer 107 may also be used as an electromigration (EM) cap in order to improve performance and reliability of the device. In some embodiments, an EM cap may be formed first and an etch stop layer 107 may be formed over the EM cap. In an embodiment, the etch stop layer 107 and/or the EM cap may be formed with a conformal process, such as an ALD process.

Figure 1D:
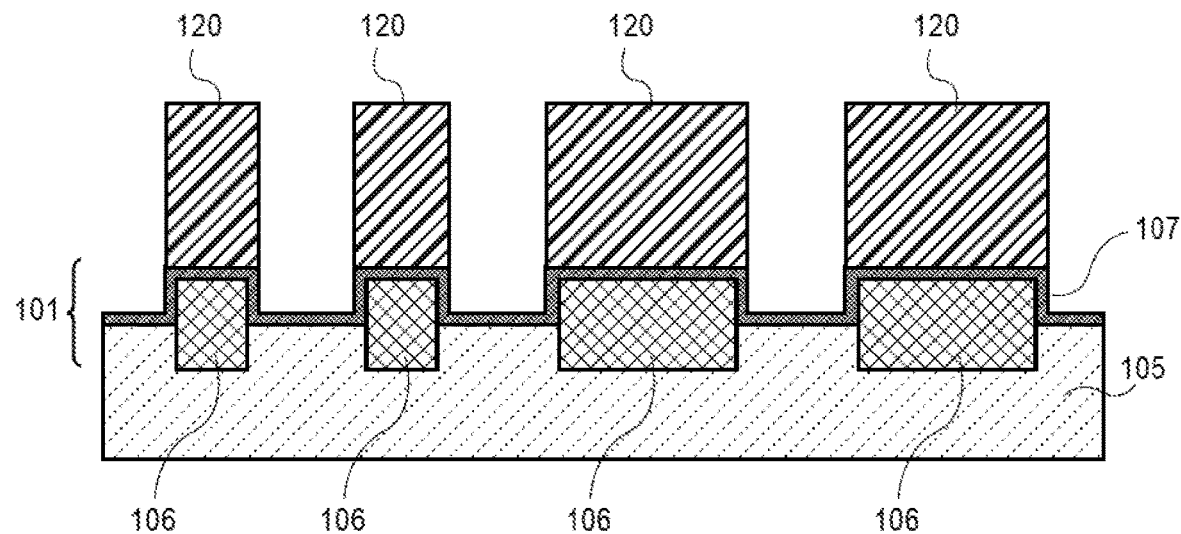
FIG. 1D is a cross-sectional illustration after a helmet layer is selectively formed over the first conductive traces, in accordance with an embodiment.

Referring now to FIG. 1D, a cross-sectional illustration after the helmets 120 are selectively disposed over the first conductive traces 106 of the first interconnect layer 101 is shown, in accordance with an embodiment. In an embodiment, the helmets 120 may comprise a dielectric material, such as $TiO_X$, $SiO_X$, SiN, CDO, CDN, or the like. In an embodiment, the helmets 120 may be high aspect ratio features. For example, the helmets 120 formed over each first conductive trace 106 may have an aspect ratio of 2:1 or greater, 5:1 or greater, 10:1 or greater, or 50:1 or greater.

In an embodiment, the selective deposition of the helmet layer is selectively formed over the first conductive traces 106 with an ALD process. In an embodiment, the ALD process may also comprise spinning a substrate on which the first interconnect layer 101 is formed. Spinning the substrate during the ALD process results in the reactant species being starved from the trenches 112. In an embodiment, the substrate may be spun at 1 revolution per minute (RPM) or greater. In a particular embodiment, the substrate may be spun at 50 RPMs or greater, 100 RPMs or greater, or 120 RPMs or greater. Since the reactant species are removed from the trenches 112, there is little (if any) deposition of the helmet material in the trenches 112. In embodiments where deposition of the helmet material occurs in the trenches 112, it may be removed with an etching process. For example, the helmet material may be cleared from the trenches while only reducing the thickness of the helmets 120.

Figure 2:
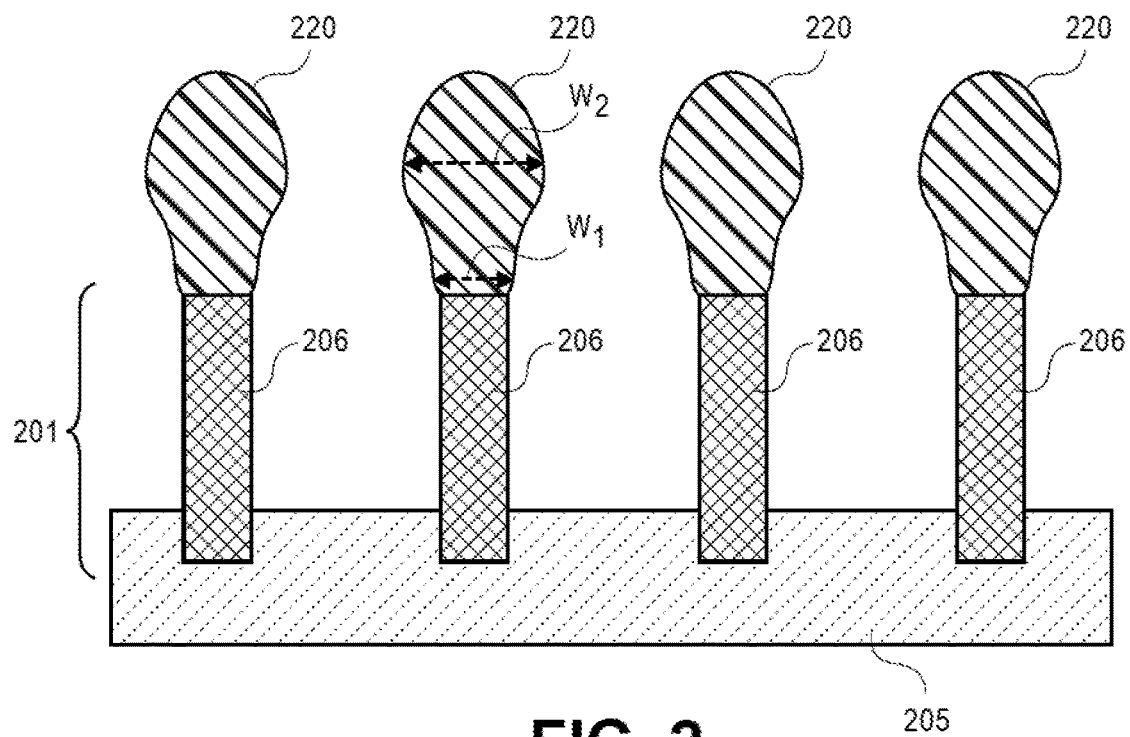
FIG. 2 is a cross-sectional illustration after the helmet layer is formed where the helmet layer comprises a non-planar surface, in accordance with an embodiment.

Referring now to FIG. 2, a cross-sectional illustration of helmets 220 formed over conductive traces 206 is shown, in accordance with an embodiment. As shown, the helmets 220 may have non-planar surfaces. In an embodiment, a width of the helmets 220 may not be uniform at all Z-heights. In an embodiment, a width at the bottom of the helmets 220 may be substantially equal to the surface on which they are supported (e.g., the width of the conductive traces 206). As the thickness of the helmets 220 increases, the width of the helmets 220 may also increase. For example, a maximum width $W_2$ of the helmets 220 may be approximately 125% or more of a width $W_1$ at a base of the helmets 220. In an embodiment, a maximum width $W_2$ of the helmets 220 may be approximately 150% or more of a width $W_1$ at a base of the helmets 220. In an embodiment, the maximum width $W_2$ is shown as being at approximately the midpoint between the uppermost surface of the helmets 220 and the base of the helmets 220. However, it is to be appreciated that the maximum width $W_2$ is not limited to being at the midpoint between the uppermost surface and the base of the helmets 220. In an embodiment, the helmets 220 may be referred to as having a balloon shape or a bulbous shape.

Figure 3A:
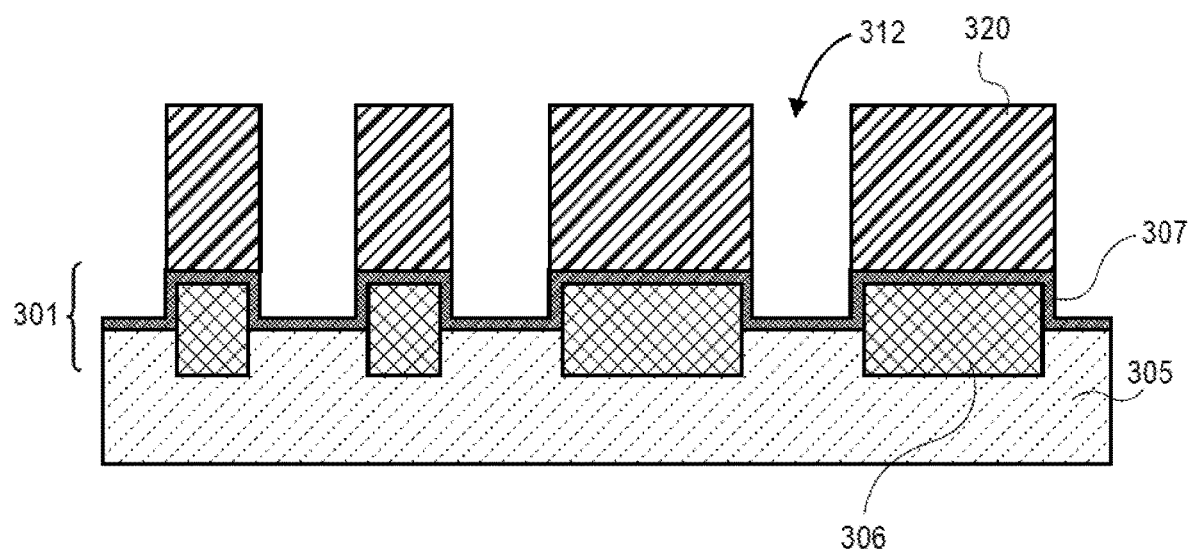
FIG. 3A is a cross-sectional illustration of a helmet layer selectively formed over first conductive traces, in accordance with an embodiment.

Referring now to FIGS. 3A-3G a process for replicating the grating pattern of the first interconnect layer in a subsequent layer is shown, in accordance with an embodiment. Referring now to FIG. 3A, a cross-sectional illustration of a first interconnect layer 301 with helmets 320 formed over the conductive traces 306 is shown, in accordance with an embodiment. In an embodiment, the device illustrated in FIG. 3A may be substantially similar to the device described with respect to FIG. 1D. As such, processes to form the device illustrated in FIG. 3A may be substantially similar to those described with respect to FIGS. 1A-1D.

Figure 3B:
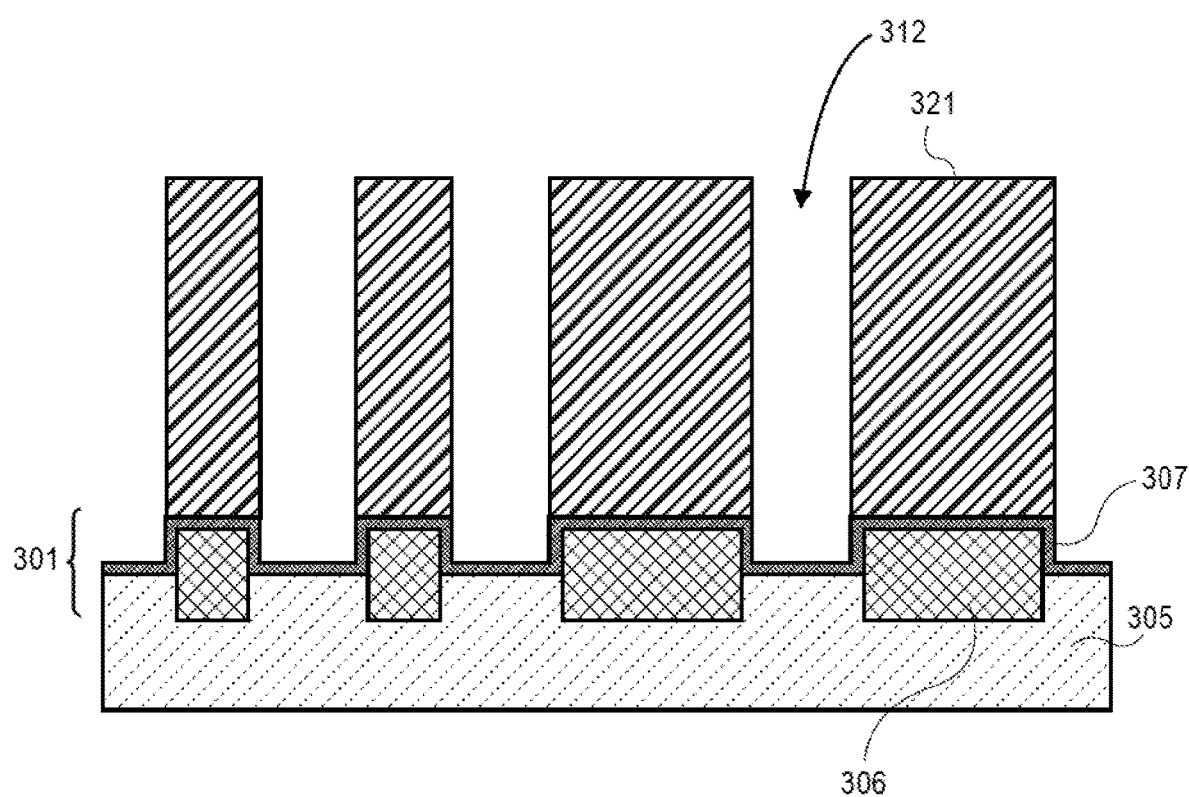
FIG. 3B is a cross-sectional illustration after the helmet layer is grown to a second height, in accordance with an embodiment.

Referring now to FIG. 3B, a cross-sectional illustration after the helmet layer 321 is grown to a second thickness is shown, in accordance with an embodiment. In an embodiment, the second thickness may be approximately 20 nm or greater, 30 nm or greater, or 50 nm or greater. In an embodiment, the thickness of the helmet layer 321 may be increased with a selective ALD process similar to the one described above. For example, the selective ALD process may include spinning the substrate on which the first interconnect layer 301 is formed.

Figure 3C:
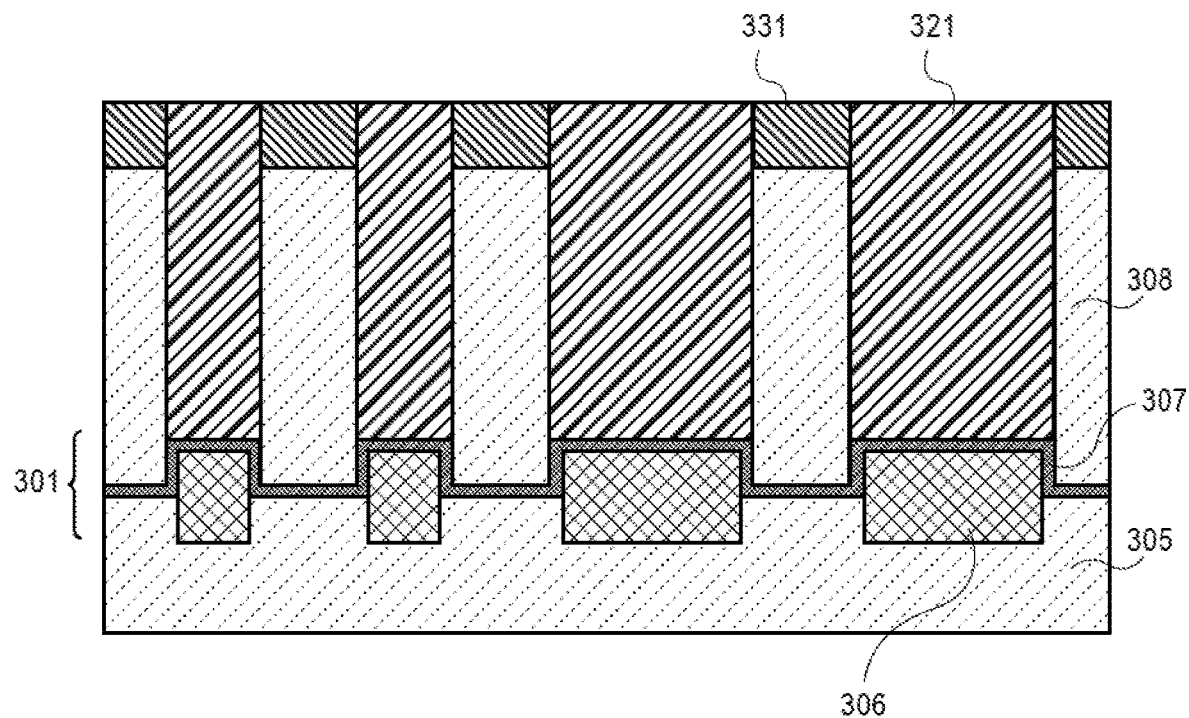
FIG. 3C is a cross-sectional illustration after a second ILD and a first hardmask is formed between the helmet layer, in accordance with an embodiment.

Referring now to FIG. 3C, a cross-sectional illustration after a second ILD 308 and a first hardmask 331 is formed in the trenches 312 between the helmets 321 is shown, in accordance with an embodiment. In an embodiment, the second ILD 308 may be formed in the trenches 312 and over an uppermost surface of the helmets 321. In such embodiments, the second ILD 308 may be etched back so an uppermost surface of the second ILD 308 is below an uppermost surface of the helmets 321. In an embodiment, the first hardmask 331 may then be disposed between the helmets 321. In an embodiment, the first hardmask 331 may be planarized (e.g., with a chemical mechanical planarization (CMP) process) with the uppermost surface of the helmets 321.

Figure 3D:
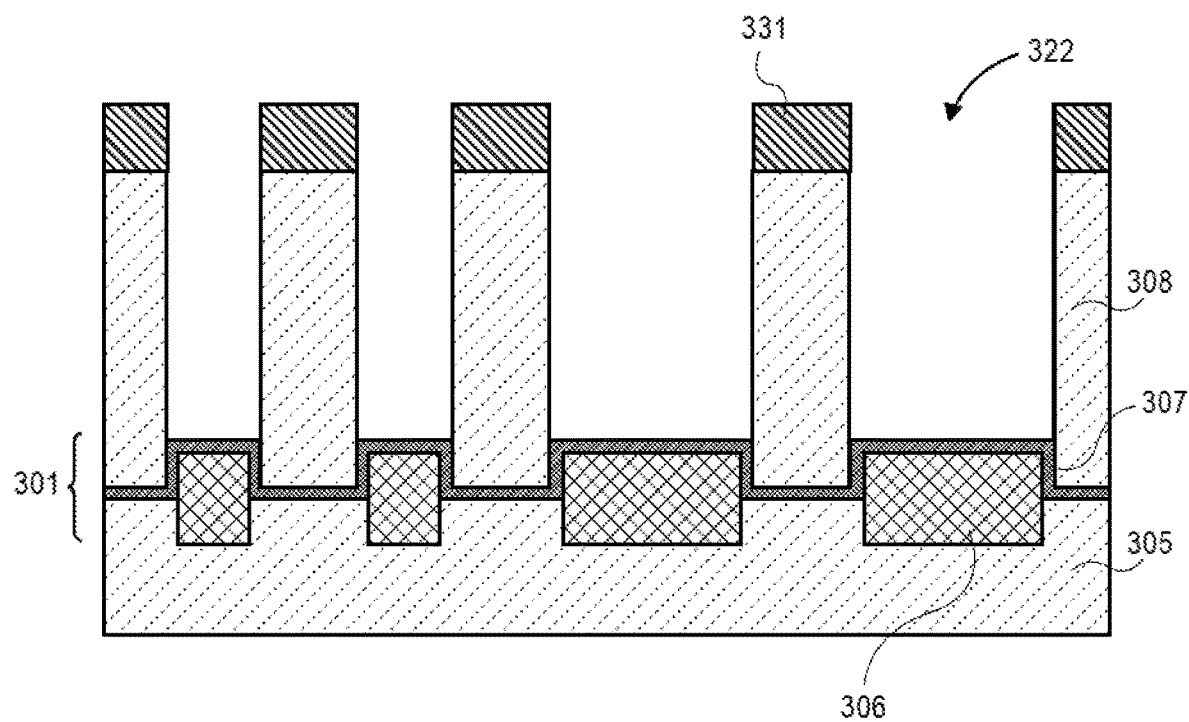
FIG. 3D is a cross-sectional illustration after the helmet layer is removed, in accordance with an embodiment.

Referring now to FIG. 3D, a cross-sectional illustration after the helmets 321 are removed is shown, in accordance with an embodiment. In an embodiment, the helmets 321 may be removed with an etching process, as is known in the art. In an embodiment, the removal of the helmets 321 results in trenches 322 being formed in the second ILD 308. In an embodiment, the trenches 322 may be substantially aligned over the first conductive traces 306. While all of the helmets 321 are shown as being removed in FIG. 3D, it is to be appreciated that in some embodiments one or more of the helmets 321 may not be removed, and may be present in the final interconnect structure.

Figure 3E:
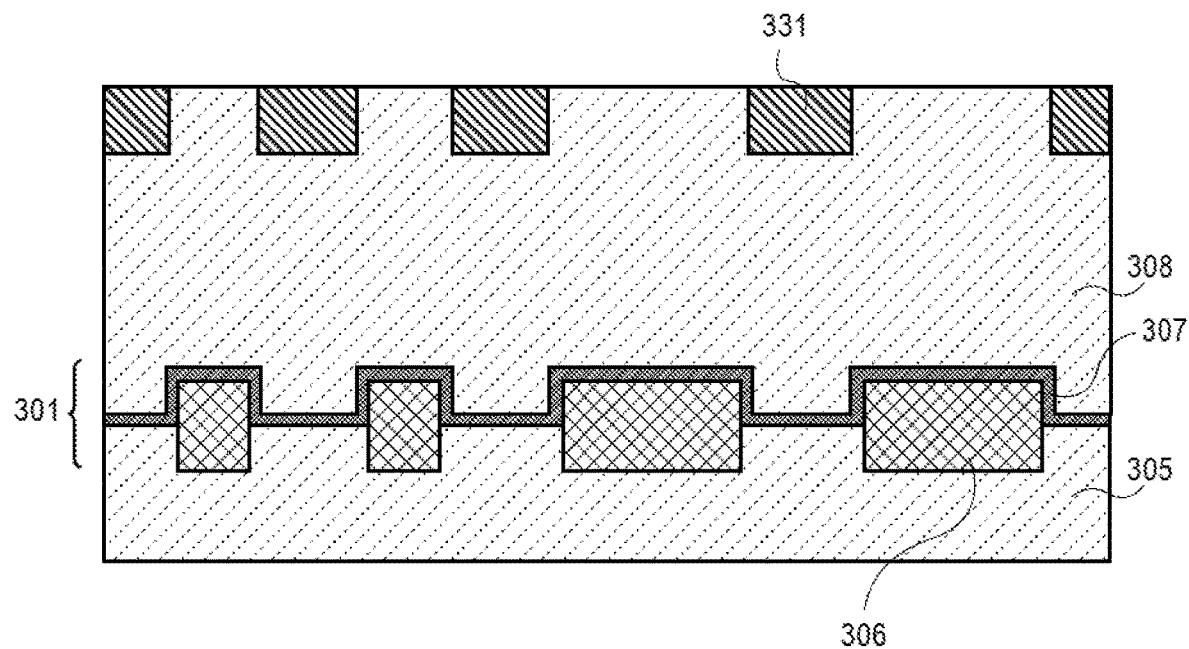
FIG. 3E is a cross-sectional illustration after a third ILD is formed in the trenches formed by the removal of the helmet layer, in accordance with an embodiment.

Referring now to FIG. 3E, a cross-sectional illustration after the trenches 322 are filled with an ILD is shown, in accordance with an embodiment. In an embodiment, the ILD used to fill the trenches 322 may be the same material as the second ILD 308, and is therefore illustrated as a single continuous layer. However, it is to be appreciated that a different ILD material may be used to fill the trenches and/or there may be discernable features in a cross-sectional analysis of the device that indicate an ILD fill was used. In an embodiment, an uppermost surface of the second ILD 308 may be planarized (e.g., with a CMP process) with an uppermost surface of the first hardmask 331.

Figure 3F:
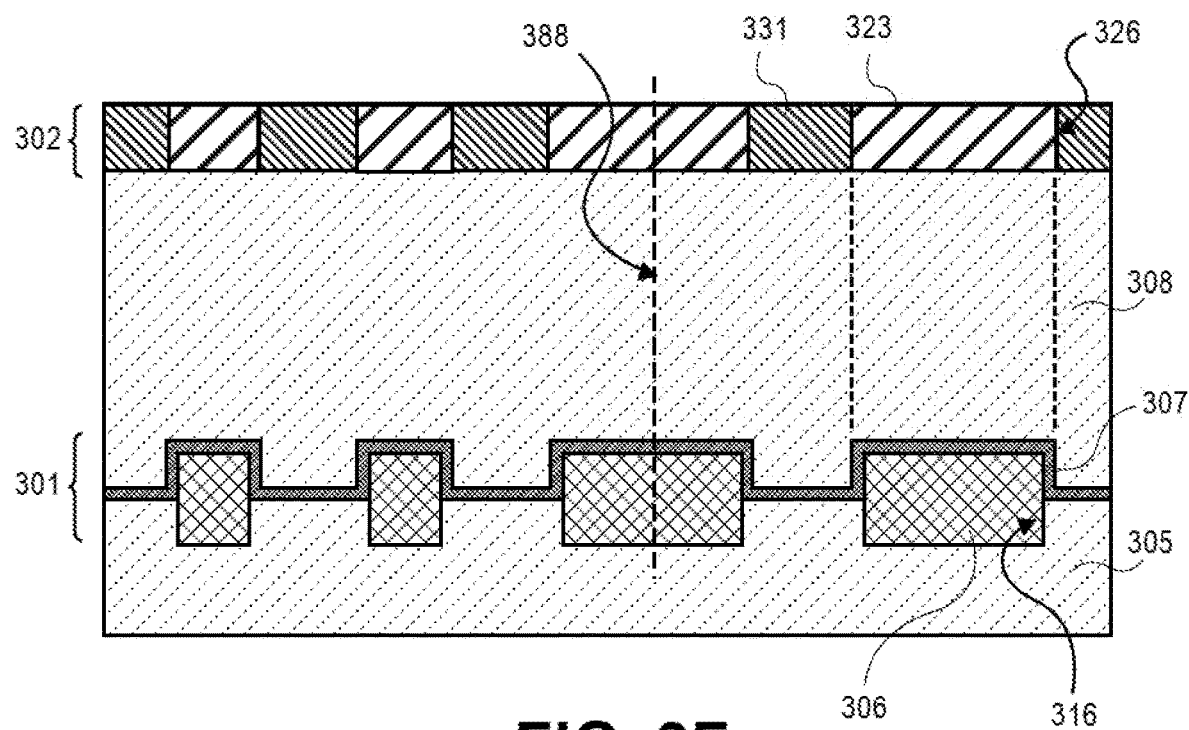
FIG. 3F is a cross-sectional illustration after a second hardmask is formed between the first hardmask layer, in accordance with an embodiment.

Referring now to FIG. 3F, a cross-sectional illustration after a second hardmask 323 is formed between the first hardmask 331 is shown, in accordance with an embodiment. In an embodiment, the second hardmask 323 may be formed by recessing the second ILD 308 (e.g., with an etching process) and filling the trenches with the second hardmask 323. In an embodiment, the second hardmask 323 may then be planarized with the first hardmask 331. Due to the processing operations described above, the second hardmask 323 may have a second grating pattern and/or feature widths that is substantially similar to the first grating pattern and/or the feature widths of the first interconnect layer 301. For example, the second grating pattern of the second hardmask 323 may have one or more pitches that are aligned with the one or more pitches of the first grating pattern of the first interconnect layer. As used herein, "aligned" refers to alignment of features that is within +/−10 nm or less, +/−5 nm or less, or +/−2 nm or less. For example, a sidewall 316 of the a first conductive trace 306 may be aligned with a sidewall 326 of the second hardmask layer 323.

Where embodiments include features that are not perfectly aligned (i.e., features that have zero misalignment), the misalignment may be attributable to controllable parameters. For example, as illustrated in FIG. 3F, sidewall 326 is not perfectly aligned to the sidewall 316 of the first conductive trace 306 due to the etch stop layer 307. Additional controllable variations in alignment may be the result of the non-uniform width of the helmets 321 described with respect to FIG. 2. However, the width of the helmets 321 is predictable and consistent and can be accounted for, in contrast to overlay error which is random. In an embodiment, centerlines 388 of a first conductive trace 306 and a feature in the second hardmask 323 may be aligned. For example, the alignment of the center lines 388 may be aligned to within +/−5 nm or less, +/−2 nm or less, or +/−1 nm or less.

Figure 3G:
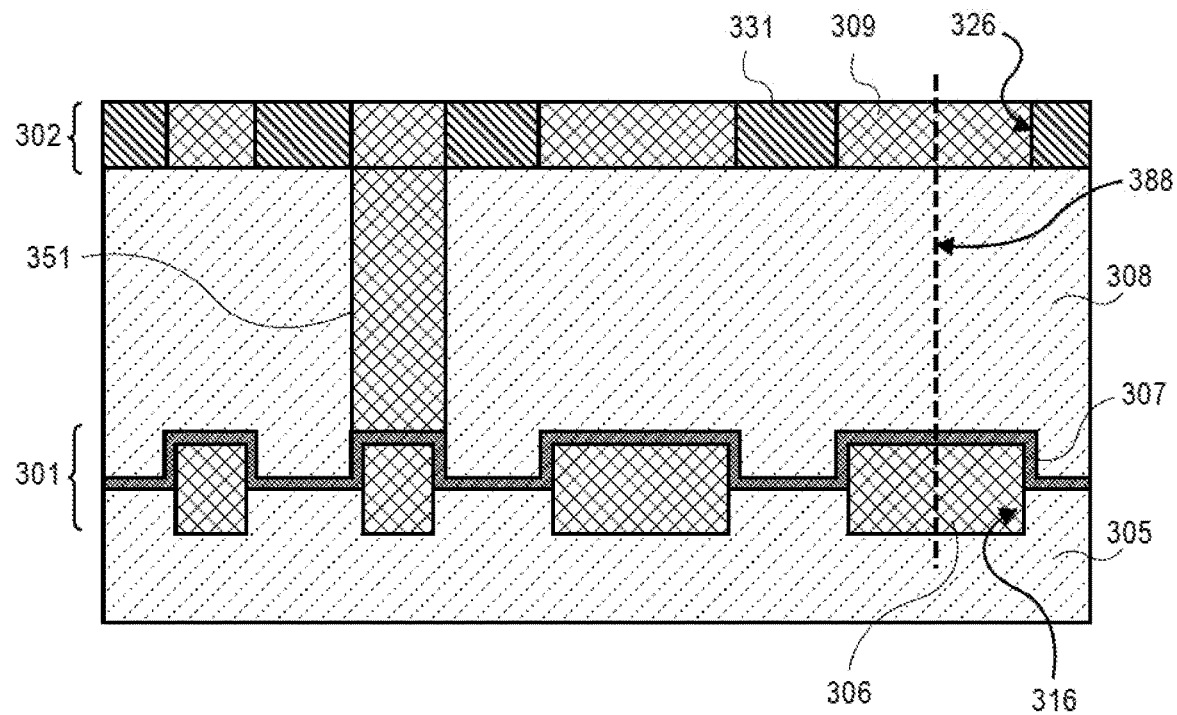
FIG. 3G is a cross-sectional illustration after the second hardmask layer is replaced with a second interconnect layer and a via, in accordance with an embodiment.

Referring now to FIG. 3G, a cross-sectional illustration after the second hardmask layer 323 is replaced with a second interconnect layer 302 and a via 351 is formed is shown, in accordance with an embodiment. In an embodiment, the second interconnect layer 302 may comprise a plurality of second conductive traces 309. In an embodiment, one or more of the second conductive traces 309 may be electrically coupled to underlying first interconnect lines 306 by a via 351.

It is to be appreciated that since the second conductive traces 309 replace the second hardmask layer 323, the second conductive traces 309 may also be aligned with the underlying first conductive traces 306. For example, a centerlines 388 of a first conductive trace 306 and a second conductive trace 309 may be aligned, and/or a sidewall 316 of the first conductive trace 306 may be aligned with a sidewall 326 of the second conductive line. In a particular embodiment where a via 351 is formed between a first conductive trace 306 and a second conductive trace 309, the via 351 may be aligned to the underlying first conductive trace 306.

In the illustrated embodiment, the second interconnect layer 302 includes a grating pattern that is the same as the grating pattern of the first interconnect layer 301. However, it is to be appreciated that the grating pattern of the second interconnect layer 302 may be substantially orthogonal to the grating pattern of the first interconnect layer 301 (as will be described in greater detail below with respect to FIGS. 5A-5Q). When the second interconnect layer 302 is orthogonal to the first interconnect layer 301, the replicated grating pattern of the second hardmask layer 323 may still be used to provide aligned vias 351 between first conductive traces 306 and second conductive traces 309.

In an additional embodiment, the topographical features used to form the helmets may also be a dielectric material that has an uppermost surface that is above an uppermost surface of the conductive lines. An example of such an embodiment is described with respect to FIGS. 4A-4H.

Figure 4A:
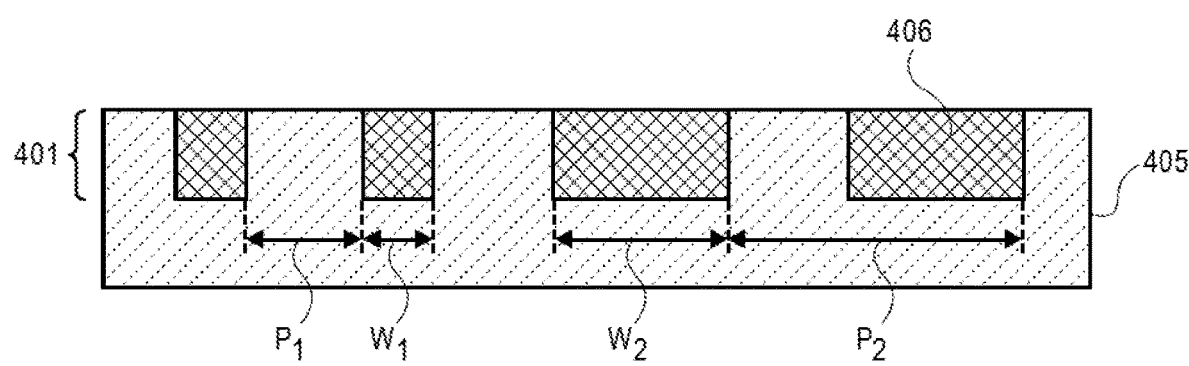
FIG. 4A is a cross-sectional illustration of a first interconnect layer that comprises a plurality of conductive traces formed in a first ILD, in accordance with an embodiment.

Referring now to FIG. 4A, a cross-sectional illustration of a first interconnect layer 401 formed in a first ILD 405 is shown, in accordance with an embodiment. In an embodiment, the first interconnect layer 401 may comprise a plurality of conductive traces 406. In an embodiment, the plurality of conductive traces 406 may be arranged in a grating pattern. In an embodiment, the grating pattern may include conductive traces 406 that are spaced at a non-uniform pitch. For example, the grating pattern of the first interconnect layer 401 may comprise a first pitch $P_1$ and a second pitch $P_2$. While a first pitch $P_1$ and a second pitch $P_2$ are shown in FIG. 4A, it is to be appreciated that the first interconnect layer 401 may comprise a uniform pitch (i.e., a single pitch) or two or more different pitches. In an embodiment, the first interconnect layer 401 may also comprise conductive traces 406 that have a non-uniform width. For example, the conductive traces 406 in FIG. 4A are illustrated as having either a first width $W_1$ or a second width $W_2$. While a first width $W_1$ and a second width $W_2$ are shown in FIG. 4A, it is to be appreciated that the first interconnect layer 401 may comprise conductive traces 406 with a uniform width (i.e., a single width) or two or more different widths.

In an embodiment, the first interconnect layer 401 may be a first interconnect layer over a semiconducting device. For example, one or more of the first conductive traces 406 of the first interconnect layer 401 may be electrically coupled to devices on an underlying semiconducting substrate (not shown) by a via. In additional embodiments, the first interconnect layer 401 may be an intermediate layer of a plurality of interconnect layers. In such embodiments, one or more of the conductive traces 406 of the first interconnect layer 401 may be electrically coupled to underlying conductive traces by one or more vias.

Figure 4B:
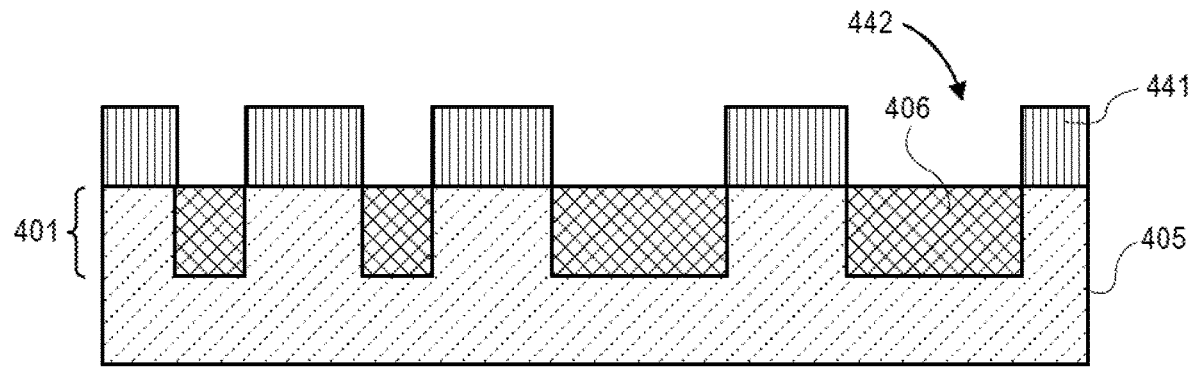
FIG. 4B is a cross-sectional illustration after an intermediate ILD is selectively formed over the exposed portions of the first ILD in order to form a topographical difference between the first conductive traces and the intermediate ILD, in accordance with an embodiment.

Referring now to FIG. 4B, a cross-sectional illustration after an intermediate ILD 441 is formed over the exposed surfaces of the first ILD 405 is shown, in accordance with an embodiment. In an embodiment, the intermediate ILD 441 may be deposited to a thickness that is sufficient to allow for the topographically-selective ALD process for forming helmets. For example, the intermediate ILD 441 may have a thickness that is 20 nm or greater. The formation of the intermediate ILD 441 generates trenches 442 that are aligned over the first conductive traces 406. In an embodiment, the intermediate ILD 441 may be formed by passivating portions of the substrate with a self-assembled monolayer (SAM) which blocks or enhances deposition. The ILD 441 may be deposited with an ALD process followed by an etch to remove defects. The process may be repeated as needed to provide an intermediate ILD 441 with a desired thickness.

Figure 4C:
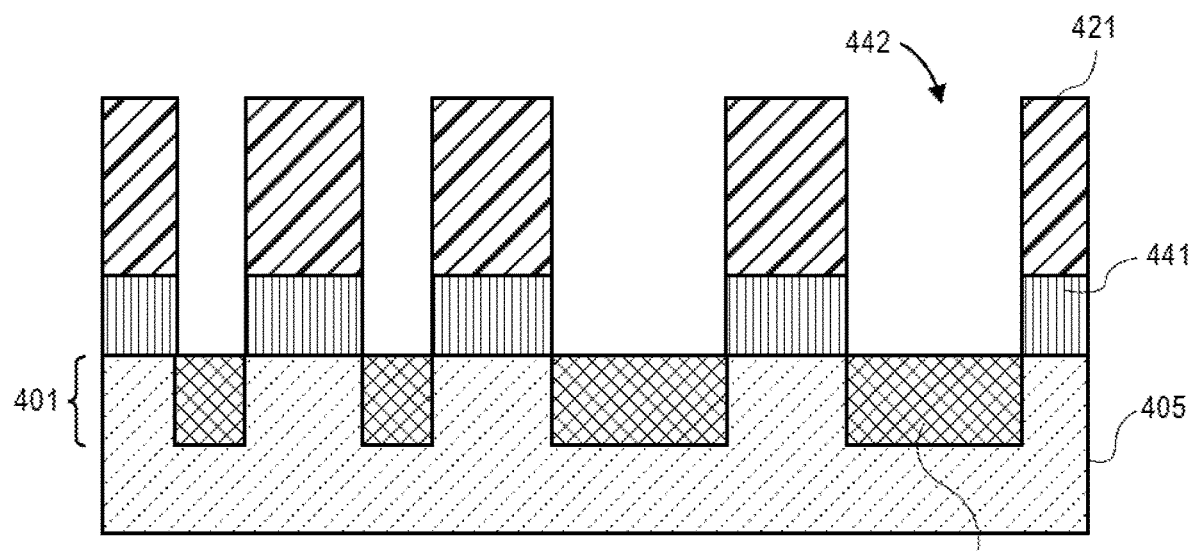
FIG. 4C is a cross-sectional illustration after a helmet layer is formed over the intermediate ILD, in accordance with an embodiment.

Referring now to FIG. 4C, a cross-sectional illustration after helmets 421 are formed over the intermediate ILD 441 is shown, in accordance with an embodiment. In an embodiment, the helmets 421 may comprise a dielectric material, such as $TiO_X$, $SiO_X$, SiN, TiN, CDO, CDN, or the like. In an embodiment, the helmets 421 may be high aspect ratio features. For example, the helmets 421 formed over each portion of the intermediate ILD 441 may have an aspect ratio of 2:1 or greater, 5:1 or greater, 10:1 or greater, or 50:1 or greater.

In an embodiment, the selective deposition of the helmet layer is selectively formed over the intermediate ILD 441 with an ALD process. In an embodiment, the ALD process may also comprise spinning a substrate on which the first interconnect layer 401 is formed. Spinning the substrate during the ALD process results in the reactant species being starved from the trenches 442. In an embodiment, the substrate may be spun at 1 revolution per minute (RPM) or greater. In a particular embodiment, the substrate may be spun at 50 RPMs or greater, 100 RPMs or greater, or 120 RPMs or greater. Since the reactant species are removed from the trenches 442, there is little (if any) deposition of the helmet material in the trenches 412. In embodiments where deposition of the helmet material occurs in the trenches 412, it may be removed with an etching process. For example, the helmet material may be cleared from the trenches while only reducing the thickness of the helmets 421. In an embodiment, the helmets 421 may be substantially similar to the helmets described above with respect to FIG. 2.

Figure 4D:
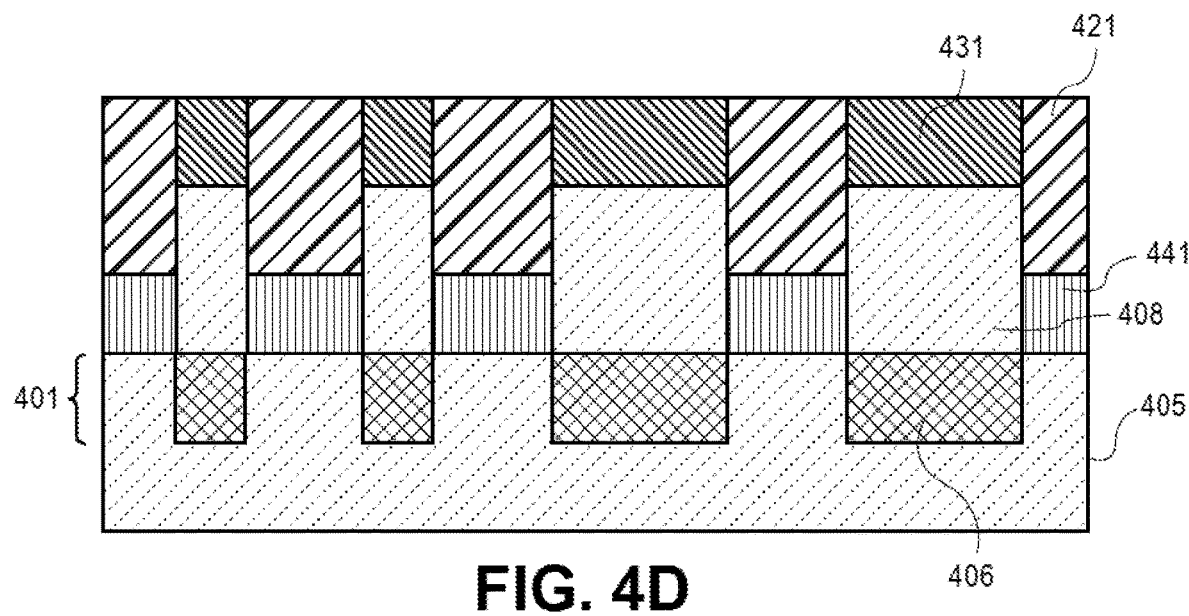
FIG. 4D is a cross-sectional illustration after a second ILD and a first hardmask is formed between the helmet layer, in accordance with an embodiment.

Referring now to FIG. 4D, a cross-sectional illustration after a second ILD 408 and a first hardmask 431 is formed in the trenches 442 between the helmets 421 is shown, in accordance with an embodiment. In an embodiment, the second ILD 408 may be formed in the trenches 442 and over an uppermost surface of the helmets 421. In such embodiments, the second ILD 408 may be etched back so an uppermost surface of the second ILD 408 is below an uppermost surface of the helmets 421. In an embodiment, the first hardmask 431 may then be disposed between the helmets 421. In an embodiment, the first hardmask 431 may be planarized (e.g., with a chemical mechanical planarization (CMP) process) with the uppermost surface of the helmets 421.

Figure 4E:
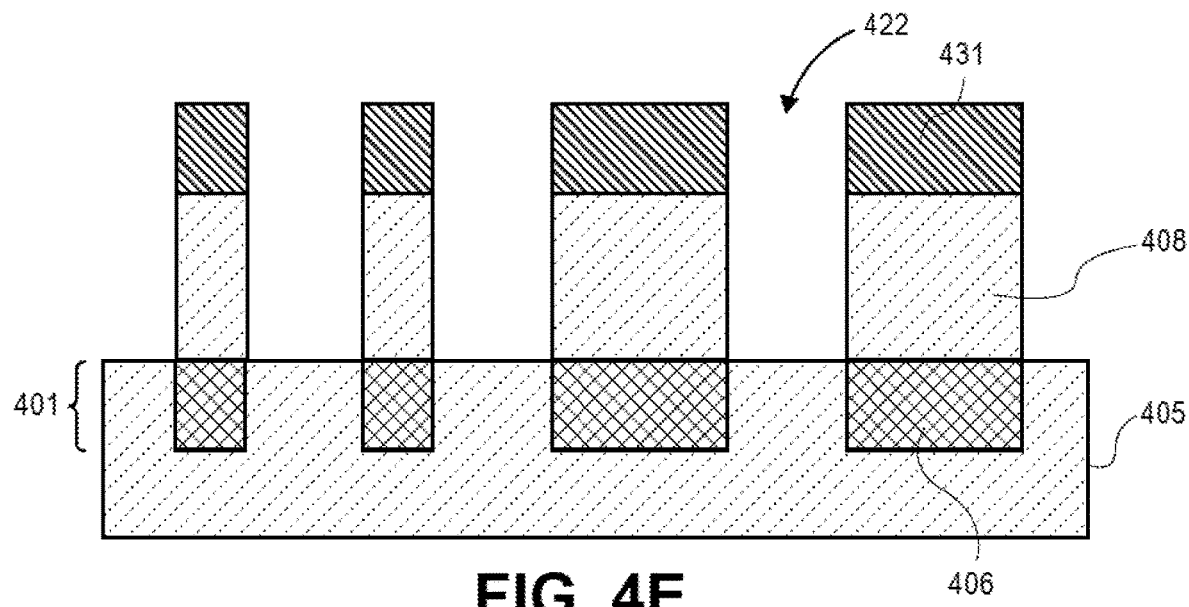
FIG. 4E is a cross-sectional illustration after the helmet layer is removed, in accordance with an embodiment layer.

Referring now to FIG. 4E, a cross-sectional illustration after the helmets 421 are removed is shown, in accordance with an embodiment. In an embodiment, the helmets 421 may be removed with an etching process, as is known in the art. In an embodiment, the removal of the helmets 421 results in trenches 422 being formed in the second ILD 408. While all of the helmets 421 are shown as being removed in FIG. 4E, it is to be appreciated that in some embodiments one or more of the helmets 421 may not be removed, and may be present in the final interconnect structure.

Figure 4F:
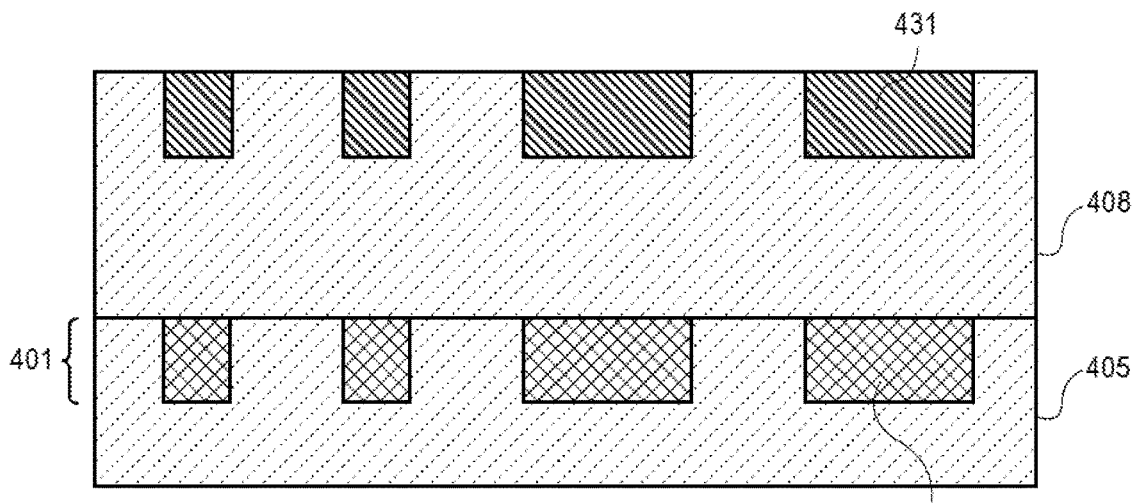
FIG. 4F is a cross-sectional illustration after a third ILD is formed in the trenches formed by the removal of the helmet layer, in accordance with an embodiment.

Referring now to FIG. 4F, a cross-sectional illustration after the trenches 422 are filled with an ILD is shown, in accordance with an embodiment. In an embodiment, the ILD used to fill the trenches 422 may be the same material as the second ILD 408, and is therefore illustrated as a single continuous layer. However, it is to be appreciated that a different ILD material may be used to fill the trenches and/or there may be discernable features in a cross-sectional analysis of the device that indicate an ILD fill was used. In an embodiment, an uppermost surface of the second ILD 408 may be planarized (e.g., with a CMP process) with an uppermost surface of the first hardmask 431.

Figure 4G:
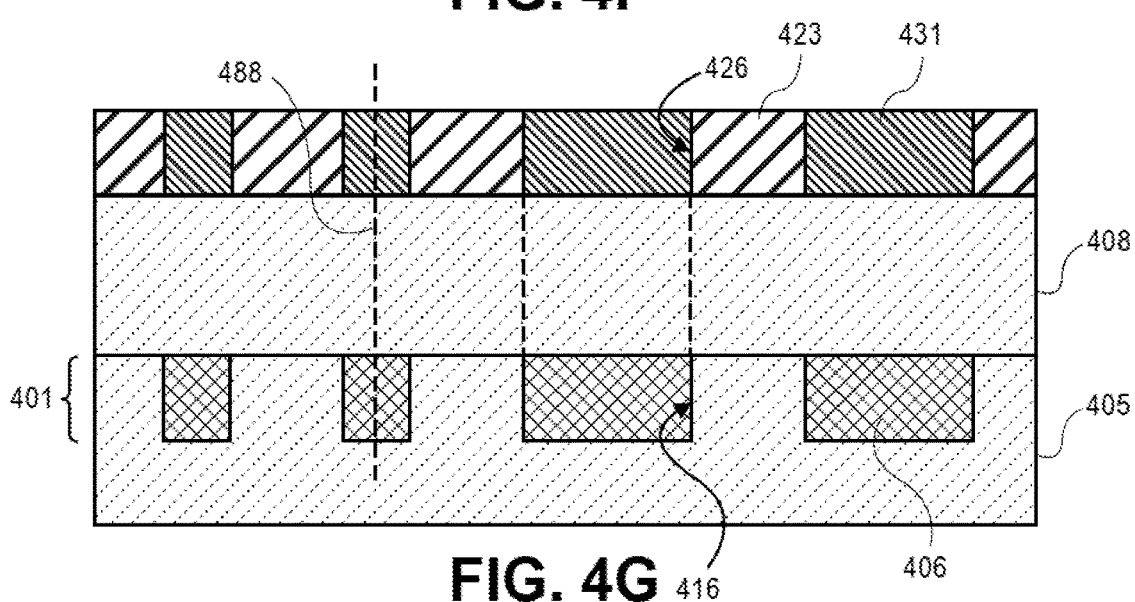
FIG. 4G is a cross-sectional illustration after a second hardmask layer is formed between the first hardmask layer, in accordance with an embodiment.

Referring now to FIG. 4G, a cross-sectional illustration after a second hardmask 423 is formed between the first hardmask 431 is shown, in accordance with an embodiment. In an embodiment, the second hardmask 423 may be formed by recessing the second ILD 408 (e.g., with an etching process) and filling the trenches with the second hardmask 423. In an embodiment, the second hardmask 423 may then be planarized with the first hardmask 431. Due to the processing operations described above, the first hardmask 431 may have a second grating pattern and/or feature widths that is substantially similar to the first grating pattern and/or the feature widths of the first interconnect layer 401. For example, the second grating pattern of the first hardmask 431 may have one or more pitches that are aligned with the one or more pitches of the first grating pattern of the first interconnect layer. As used herein, "aligned" refers to alignment of features that is within +/−10 nm or less, +/−5 nm or less, or +/−2 nm or less. For example, a sidewall 416 of the first conductive trace 406 may be aligned with a sidewall 426 of the first hardmask layer 431.

Where embodiments include features that are not perfectly aligned (i.e., features that have zero misalignment), the misalignment may be attributable to controllable parameters. For example, controllable variations in alignment may be the result of the non-uniform width of the helmets 421 described with respect to FIG. 2. However, the width of the helmets 421 is predictable and consistent and can be accounted for, in contrast to overlay error which is random. In an embodiment, centerlines 488 of a first conductive trace 406 and a feature in the first hardmask 431 may be aligned. For example, the alignment of the centerlines 488 may be aligned to within +/−5 nm or less, +/−2 nm or less, or +/−1 nm or less.

Figure 4H:
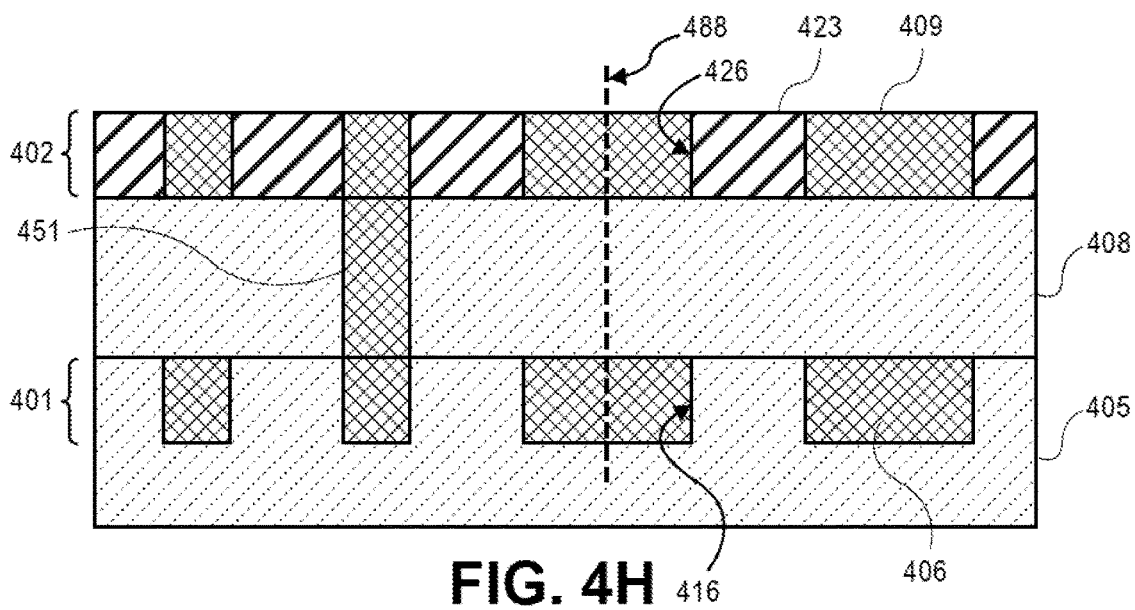
FIG. 4H is a cross-sectional illustration after the second hardmask layer is replaced with a second interconnect layer and a via, in accordance with an embodiment.

Referring now to FIG. 4H, a cross-sectional illustration after the first hardmask layer 431 is replaced with a second interconnect layer 402 and a via 451 is formed is shown, in accordance with an embodiment. In an embodiment, the second interconnect layer 402 may comprise a plurality of second conductive traces 409. In an embodiment, one or more of the second conductive traces 409 may be electrically coupled to underlying first interconnect lines 406 by a via 451.

It is to be appreciated that since the second conductive traces 409 replace the first hardmask layer 431, the second conductive traces 409 may also be aligned with the underlying first conductive traces 406. For example, a centerlines 488 of a first conductive trace 406 and a second conductive trace 409 may be aligned, and/or a sidewall 416 of the first conductive trace 406 may be aligned with a sidewall 426 of the second conductive line 409. In a particular embodiment where a via 451 is formed between a first conductive trace 406 and a second conductive trace 409, the via 451 may be aligned to the underlying first conductive trace 406.

In the illustrated embodiment, the second interconnect layer 402 includes a grating pattern that is the same as the grating pattern of the first interconnect layer 401. However, it is to be appreciated that the grating pattern of the second interconnect layer 402 may be substantially orthogonal to the grating pattern of the first interconnect layer 401 (as will be described in greater detail below with respect to FIGS. 5A-5Q). When the second interconnect layer 402 is orthogonal to the first interconnect layer 401, the replicated grating pattern of the first hardmask layer 431 may still be used to provide aligned vias 451 between first conductive traces 406 and second conductive traces 409.

Figure 5A:
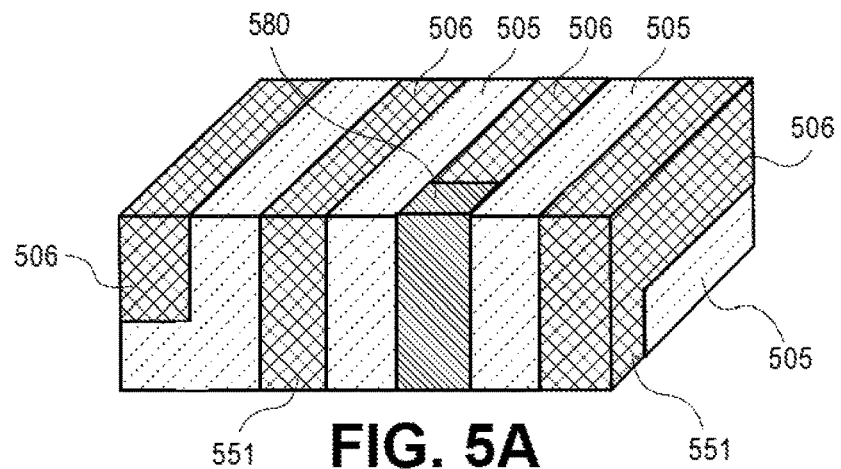
FIG. 5A is a perspective view of a first interconnect layer comprising a plurality of conductive traces formed in a first ILD, in accordance with an embodiment.
Figure 5B:
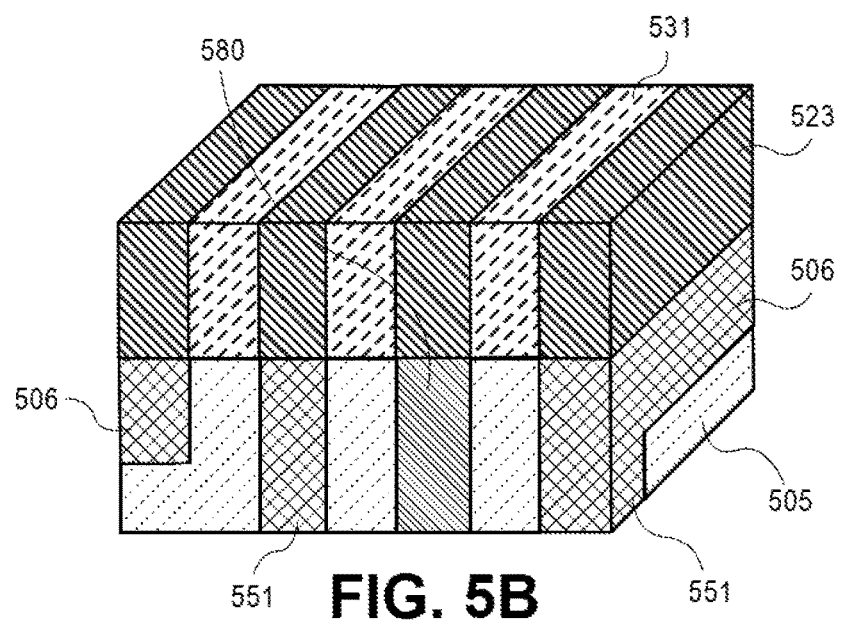
FIG. 5B is a perspective view after a grating pattern of the first interconnect layer is replicated with a first hardmask and a second hardmask, in accordance with embodiments described herein.
Figure 5C:
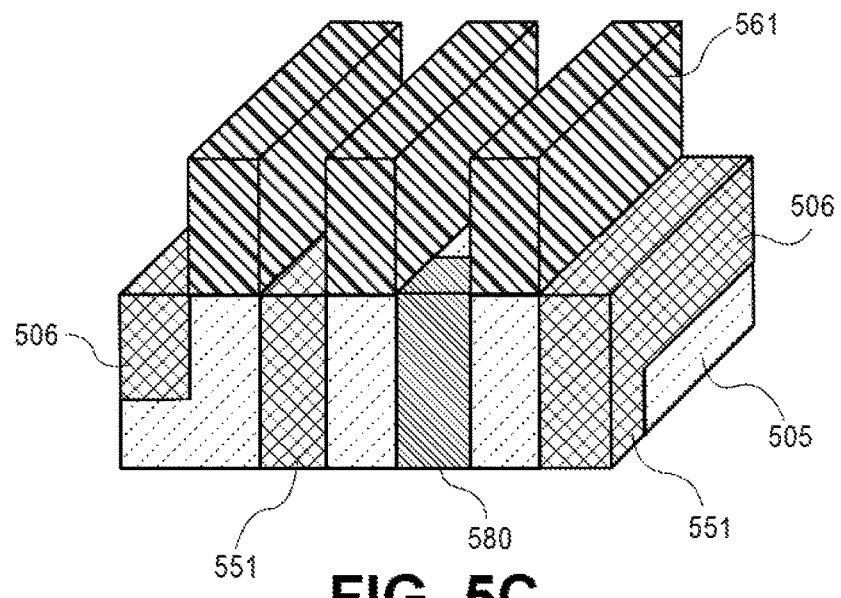
FIG. 5C is a perspective view after a sacrificial material is deposited in place of one of the first and second hardmask layers, in accordance with an embodiment.
Figure 5D:
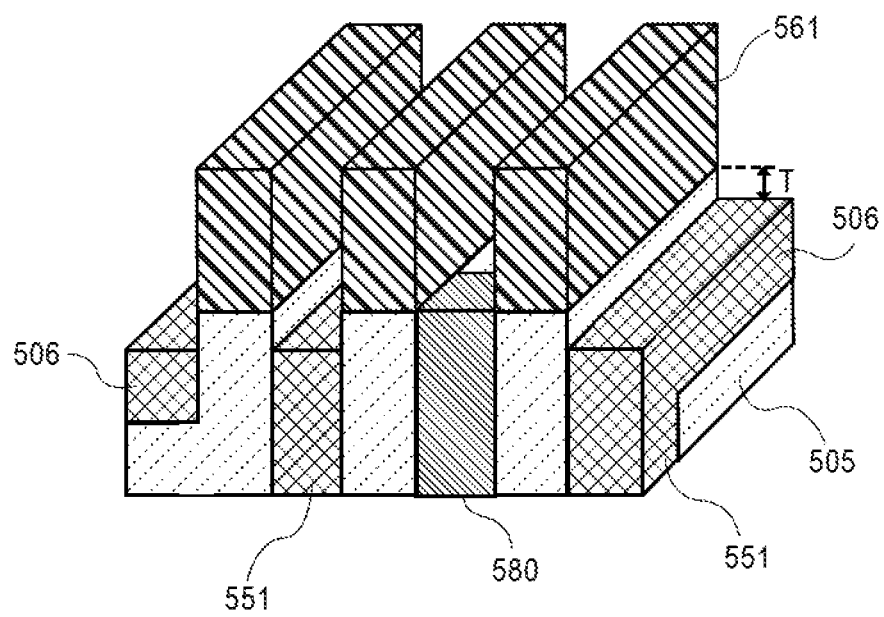
FIG. 5D is a perspective view after the conductive traces are recessed, in accordance with an embodiment.
Figure 5E:
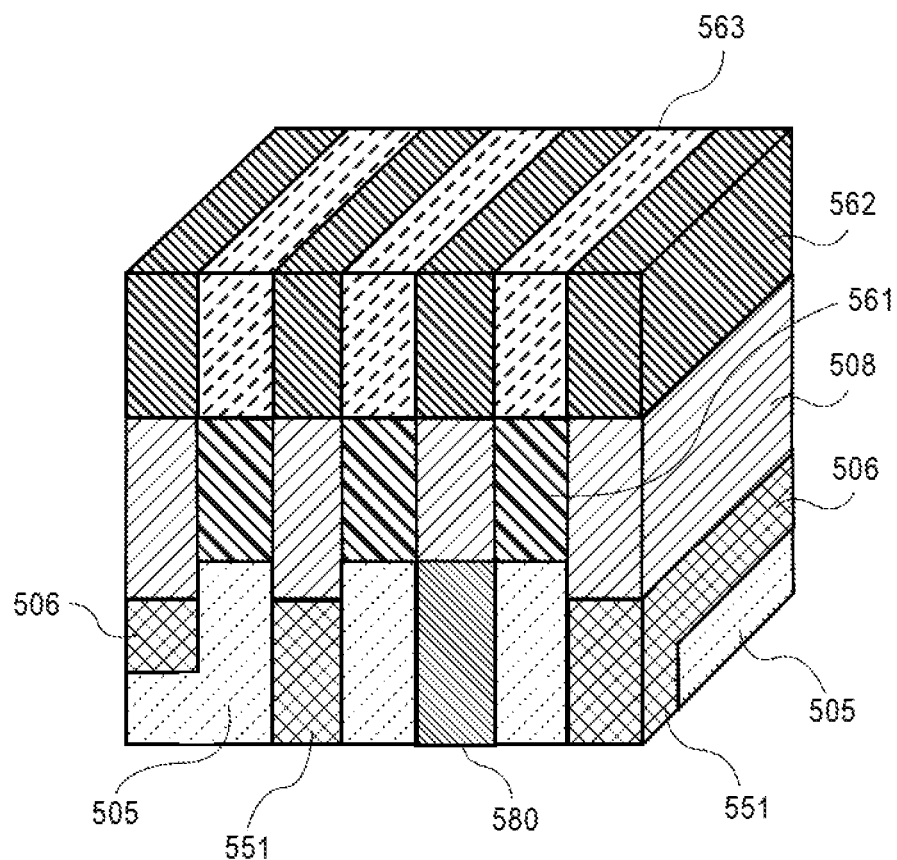
FIG. 5E is a perspective view after the grating pattern is replicated a second time with third and fourth hardmasks, in accordance with an embodiment.
Figure 5F:
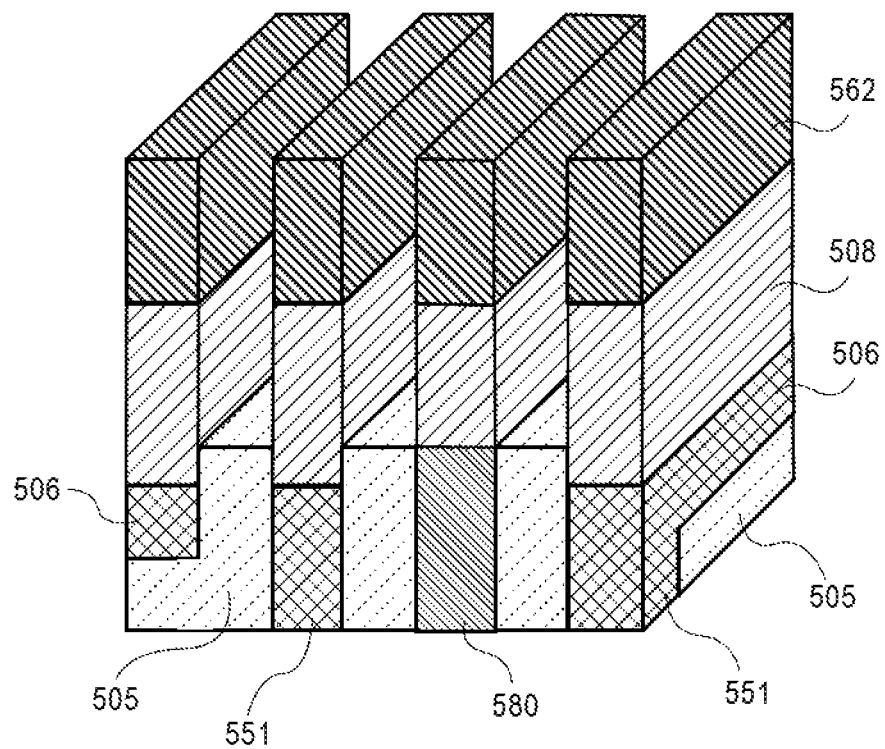
FIG. 5F is a perspective view after the third hardmask is removed, in accordance with an embodiment.
Figure 5G:
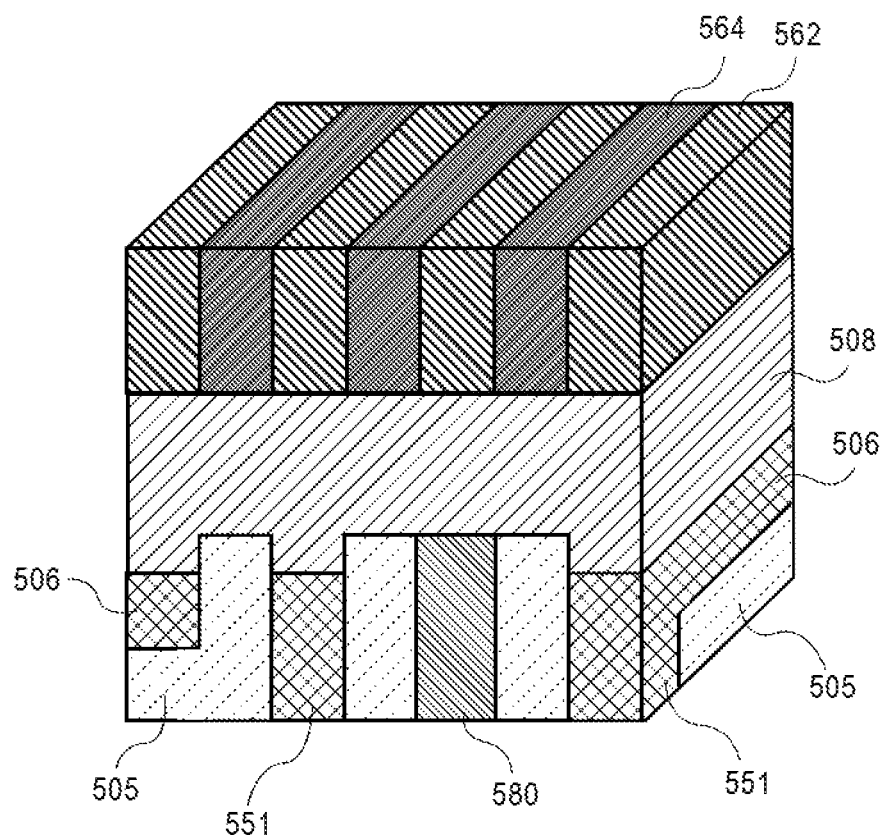
FIG. 5G is a perspective view after an ILD and a fifth hardmask fills the trenches formed by the removal of the third hardmask, in accordance with an embodiment.
Figure 5H:
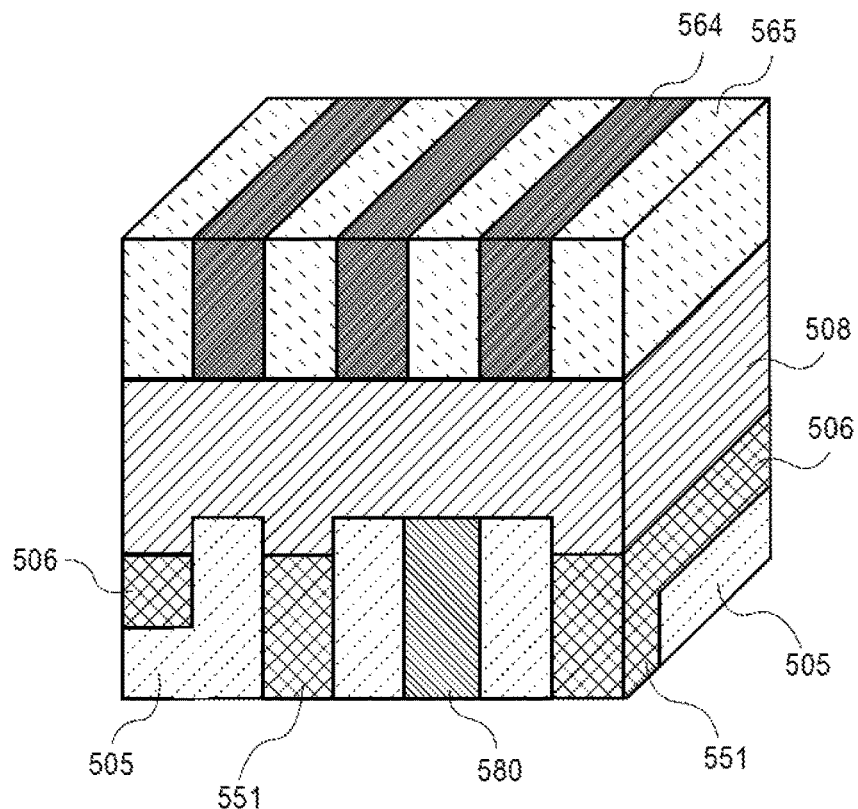
FIG. 5H is a perspective view after a cross-grating material replaces the fourth hardmask, in accordance with an embodiment.
Figure 5I:
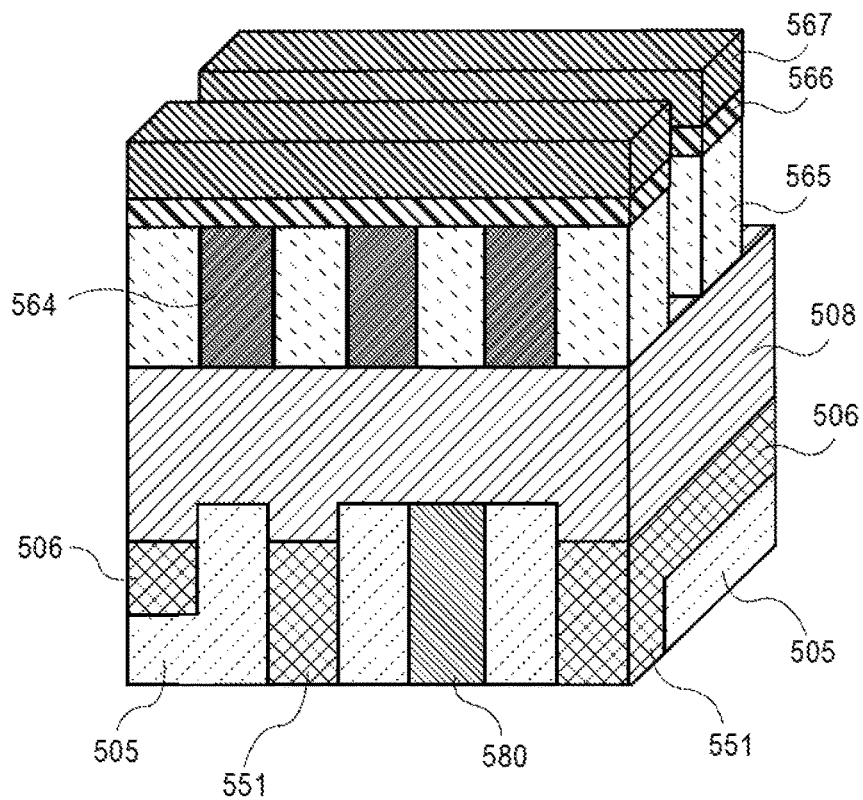
FIG. 5I is a perspective view after a second grating pattern that is orthogonal to the first grating pattern is formed into the fifth hardmask and cross grating material, in accordance with an embodiment.
Figure 5J:
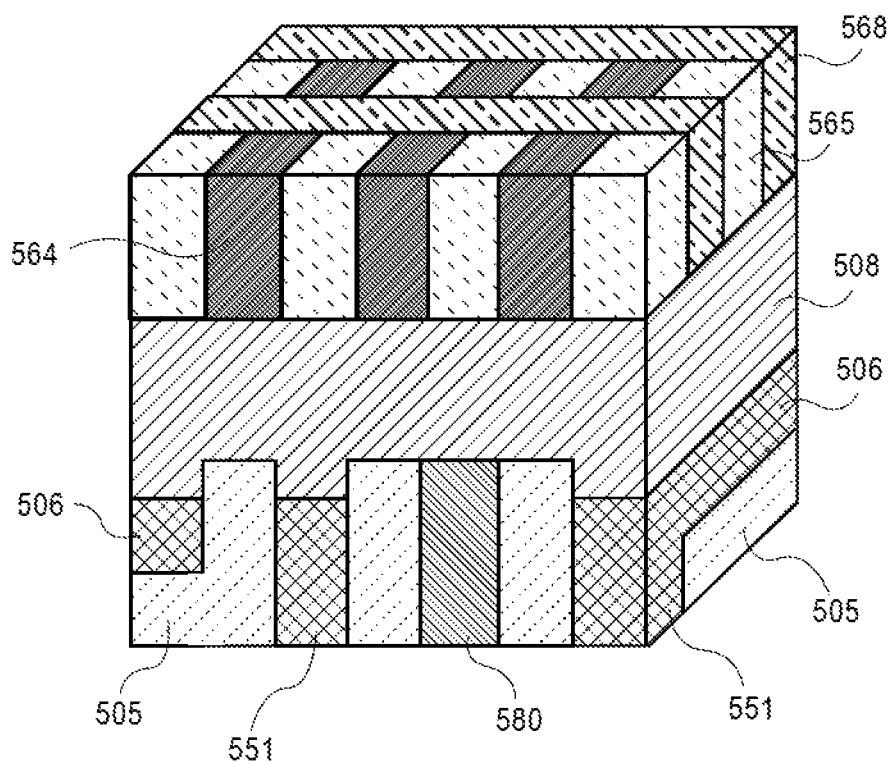
FIG. 5J is a perspective view after a cross-grating hardmask is disposed into the second grating pattern, in accordance with an embodiment.
Figure 5K:
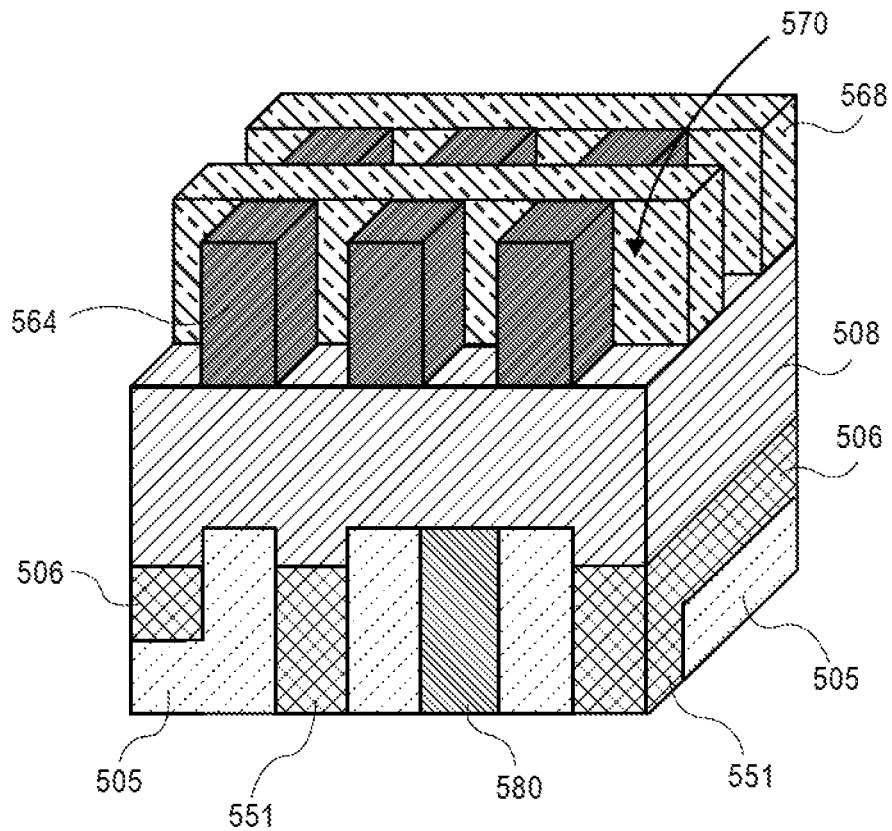
FIG. 5k is a perspective view after the cross grating material is selectively removed to reveal portions of the second ILD, in accordance with an embodiment.
Figure 5L:
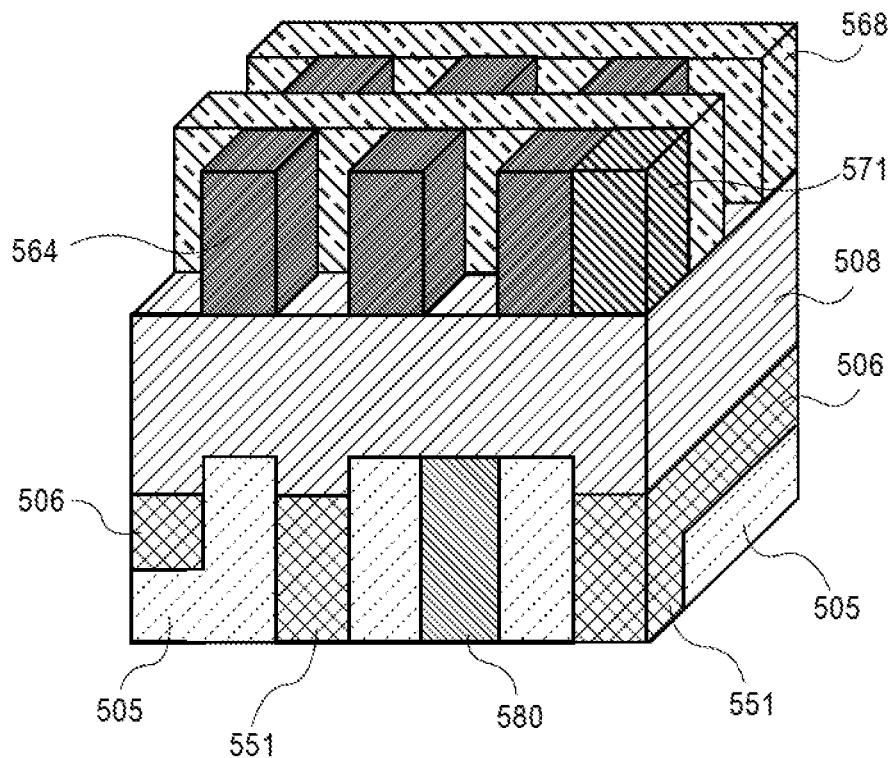
FIG. 5L is a perspective view after a plug is formed in one of the openings, in accordance with an embodiment.
Figure 5M:
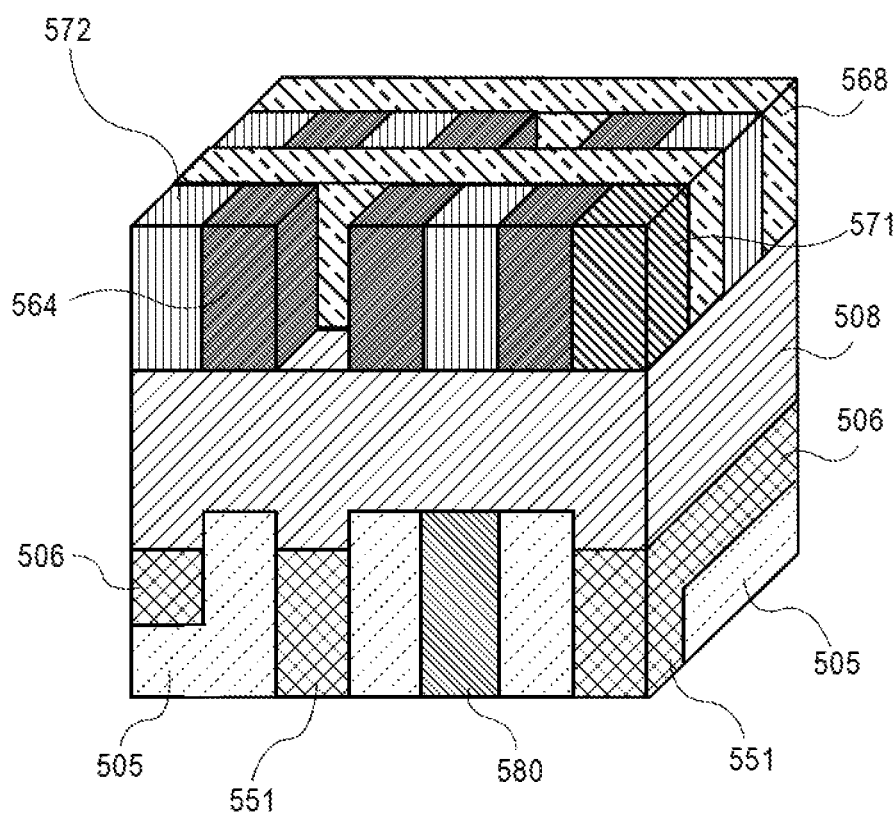
FIG. 5M is a perspective view after a photoresist is disposed and patterned to cover selected portions of the second ILD where a via is not desired, in accordance with an embodiment.
Figure 5N:
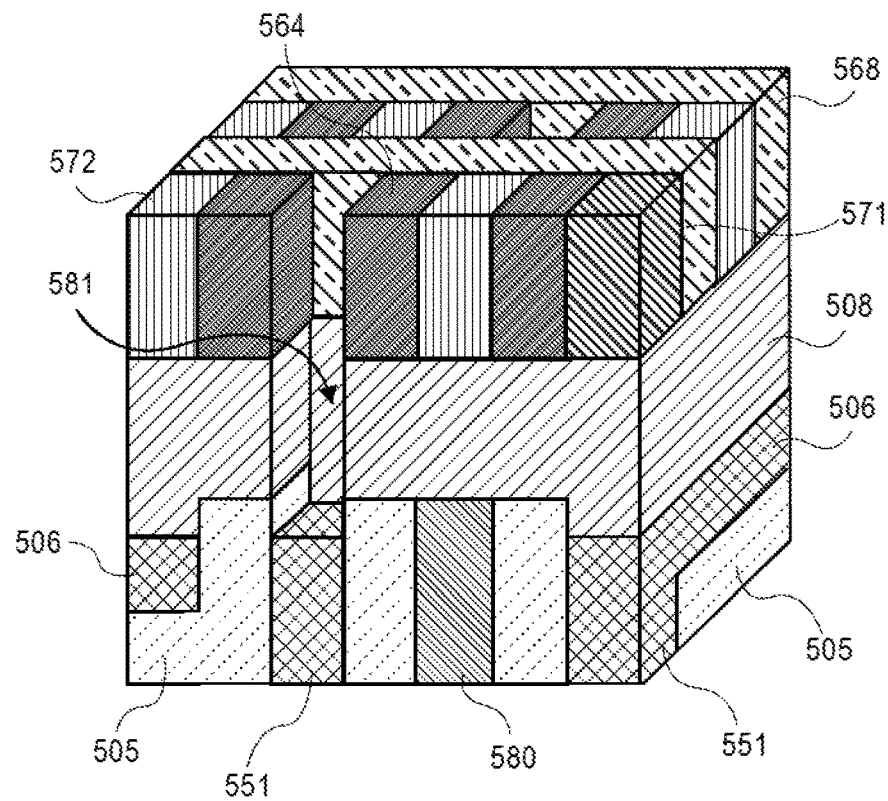
FIG. 5N is a perspective view after via openings are formed in the second ILD, in accordance with an embodiment.
Figure 5O:
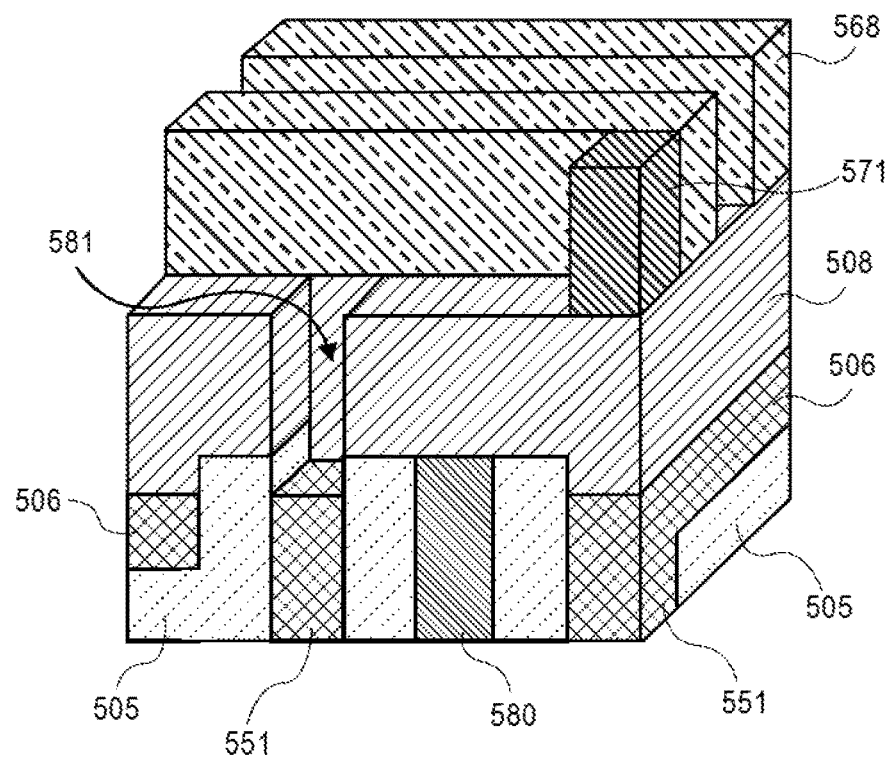
FIG. 5O is a perspective view after the photoresist and the hardmask material is removed, in accordance with an embodiment.
Figure 5P:
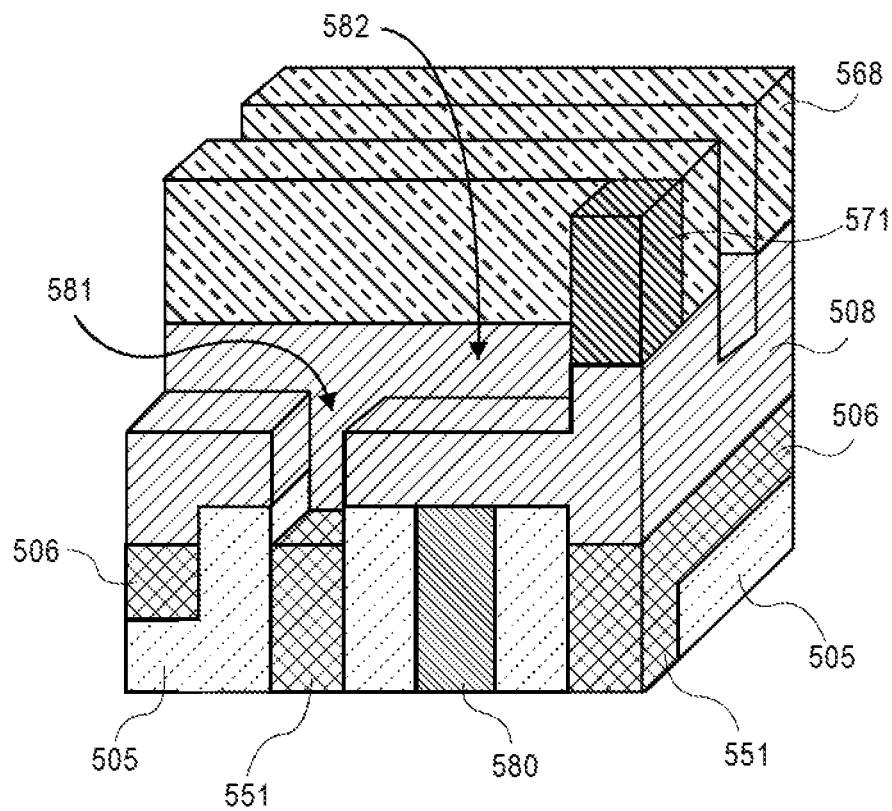
FIG. 5P is a perspective view after the second grating pattern is transferred into the second ILD, in accordance with an embodiment.
Figure 5Q:
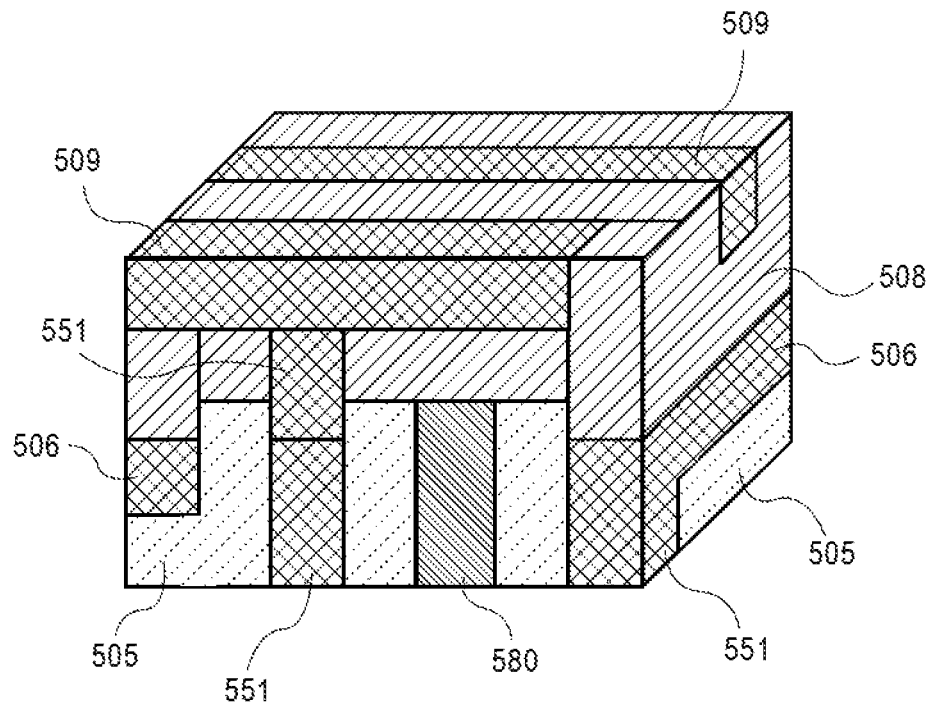
FIG. 5Q is a perspective view after the vias and second interconnect layer are disposed into the second ILD, in accordance with an embodiment.

Referring now to FIGS. 5A-5Q, perspective view illustrations of a process of forming an interconnect structure is shown in accordance with an embodiment. The process flow may utilize a grating replication process that includes a topographically-selective ALD process to form helmets similar to the processes described above. In the process flow illustrated in FIGS. 5A-5Q the grating pattern of the first interconnect layer and the grating pattern of the second interconnect layer are illustrated as being orthogonal to each other. However, it is to be appreciated that a grating replication process is still used. For example, the replicated grating pattern may be used to aid in the formation of photo bucket structures used to form plugs and vias.

Referring now to FIG. 5A, a perspective view of an interconnect structure is shown, in accordance with an embodiment. In an embodiment, the interconnect structure may comprise a plurality of first conductive traces 506 formed with a first grating pattern into a first ILD 505. In an embodiment, one or more plugs 580 may be formed at the ends of one or more conductive traces 506. In an embodiment, one or more vias 551 may connect conductive traces 506 to underlying conductive features (not shown). In the embodiment illustrated in FIG. 5A, the first grating pattern includes a single pitch. However, it is to be appreciated that the first grating pattern may also comprise a plurality of different pitches, similar to the embodiments described above. Furthermore, it is to be appreciated that the first grating pattern may also comprise feature widths that are non-uniform, similar to the embodiments described above.

Referring now to FIG. 5B, a perspective illustration after the first grating pattern is replicated with a first hardmask 531 and a second hardmask 523 is shown, in accordance with an embodiment. In an embodiment, the first hardmask 531 and the second hardmask 523 may be formed with processes substantially similar to those described above. For example, helmets (not shown) may be formed over the conductive traces 506 or the first ILD 505 with a topographically-selective ALD process.

Referring now to FIG. 5C, a perspective illustration after the first hardmask 531 is replaced with a sacrificial material 561 is shown, in accordance with an embodiment. In an embodiment, the sacrificial material 561 may be deposited after the first hardmask is removed (e.g., with an etching process). The sacrificial material 561, therefore, may maintain the first grating pattern of the first hardmask 531. In an embodiment, after the sacrificial material 561 is deposited, the second hardmask 523 may be removed to expose surfaces of the first conductive traces 506.

Referring now to FIG. 5D, a perspective illustration after the first conductive traces 505 are recessed is shown, in accordance with an embodiment. In an embodiment, an uppermost surface of the first conductive traces 506 may be recessed so that the uppermost surface of the first conductive traces 506 are below an uppermost surface of the first ILD 505. For example, the first conductive traces 506 may be recessed a distance T. For example, the distance T may be 5 nm or greater, 10 nm or greater, or 20 nm or greater.

Referring now to FIG. 5E, a perspective illustration is shown after the grating is replicated again with third hardmask 563 and fourth hardmask 562. In an embodiment, the grating replication may be implemented with a topographically-selective ALD process similar to those described above. In an embodiment, a second ILD 508 may be formed between the sacrificial layer 561. In an embodiment, the second ILD 508 separates the first conductive traces 506 from the fourth hardmask layer 562.

Referring now to FIG. 5F, a perspective illustration after the third hardmask 563 and the sacrificial layer 561 is removed is shown, in accordance with an embodiment. In an embodiment, the third hardmask layer 563 and the sacrificial layer 561 may be removed with one or more etching processes as is known in the art.

Referring now to FIG. 5G, a perspective illustration after the trenches formed by the removal of the sacrificial layer 561 are filled with an ILD and a fifth hardmask 564 is formed between the fourth hardmask 562. In an embodiment, the ILD that fills the trench may be the same ILD as the second ILD 508. As such, it is shown in FIG. 5G as being a single continuous layer. However, it is to be appreciated that a different ILD material may be used to fill the trenches and/or there may be discernable features in a cross-sectional analysis of the device that indicate an ILD fill was used. In an embodiment, the grating pattern of the fifth hardmask 564 and the fourth hardmask 562 may match the grating pattern of the first conductive traces 506.

Referring now to FIG. 5H, a perspective illustration after the fourth hardmask 562 is replaced with a first cross-grating material 565 is shown, in accordance with an embodiment. In an embodiment, the first cross-grating material 565 may be a hardmask material. In an embodiment, the fourth hardmask material 562 may be removed with an etching process, as is known in the art.

Referring now to FIG. 5I, a perspective illustration after a cross-grating lithography and patterning process is implemented is shown, in accordance with an embodiment. In an embodiment, the lithographic process may comprise an anti-reflective coating layer 566 and a photoresist layer 567. In an embodiment, the photoresist layer 567 may be exposed to actinic radiation and developed to form a cross-grating mask, as is known in the art. In an embodiment, the cross-grating may be substantially orthogonal to the first grating of the underlying first conductive traces 506. In an embodiment, the cross-grating pattern may then be transferred into the fifth hardmask 564 and the cross-grating material 565.

Referring now to FIG. 5J, a perspective illustration after a cross-grating hardmask 568 is disposed into the trenches formed by the cross-grating lithography is shown, in accordance with an embodiment. In an embodiment, the cross-grating hardmask 568 may be blanket deposited and planarized with the uppermost surfaces of the fifth hardmask 564 and the cross-grating material 565 with a CMP process, or the like. In an embodiment, the uppermost surfaces now comprise both a replication of the first grating pattern of the first conductive traces and the cross-grating pattern.

Referring now to FIG. 5K, a perspective illustration after the cross-grating material 565 is removed is shown, in accordance with an embodiment. In an embodiment, the cross-grating material 565 may be removed with an etching process, as is known in the art. The removal of the cross-grating material 565 results in the formation of photo-bucket openings 570. Due to the replication of the grating pattern, the photo-bucket openings 570 are aligned with the underlying conductive traces 506. As such, embodiments allow for the formation of plugs and vias that are aligned to the underlying first conductive traces 506.

Referring now to FIG. 5L, a perspective view illustration after a plug hardmask 571 is disposed in one or more of the photo-bucket opening 570 is shown, in accordance with an embodiment. In an embodiment, the plug hardmask 571 is a material that is etch selective to the cross-grating hardmask 568 and the fifth hardmask 564. In an embodiment, the plug hardmask 571 may be disposed into all of the photo bucket openings 570 and selectively etched from the openings where a plug 571 is not desired with a lithography and etching process.

Referring now to FIG. 5M, a perspective illustration after a via photoresist 572 is deposited into photo bucket openings 570 where a via is not desired is shown, in accordance with an embodiment. In an embodiment, the via photoresist 572 may be a positive photoresist. In other embodiments a negative resist may be used.

Referring now to FIG. 5N, a perspective illustration after the exposed underlying second ILD 508 that is removed to form via openings 581 is shown, in accordance with an embodiment. In an embodiment, the via openings 581 may be formed with an etching process that utilizes the via photoresist 572, the fifth hardmask 564 and the cross-grating hardmask 568 as an etch mask. It is to be appreciated that since the first grating pattern was replicated in subsequent layers, the via openings 581 are aligned with the underlying first conductive traces 506.

Referring now to FIG. 5O, a perspective illustration after the fifth hardmask 564 and the via photoresist 572 are removed is shown, in accordance with an embodiment. In an embodiment, the via photoresist 572 may be removed with an ashing process. In an embodiment, the fifth hardmask 564 may be removed with an etching process that is selective to the cross-grating hardmask 568, the plug hardmask 571, and the underlying second ILD 508.

Referring now to FIG. 5P, a perspective illustration after the cross-grating hardmask 568 is transferred into the second ILD 508 is shown, in accordance with an embodiment. In an embodiment, the second ILD 508 may be patterned with an etching process that is selective to the cross-grating hardmask 568 and the plug hardmask 571. The removal of portions of the second ILD 508 forms trenches 582 for second conductive traces.

Referring now to FIG. 5Q, a perspective illustration after the vias 551 and the second conductive traces 509 are formed is shown, in accordance with an embodiment. In an embodiment the vias 551 are aligned to both the first conductive traces 506 and the second conductive traces 509. Furthermore, the plug hardmask 571 results in the formation of a plug at the end of a second conductive trace 509 that is aligned with the second conductive trace 509.

It is to be appreciated that the layers and materials described above may be formed in, on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level back end of line (BEOL) interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), atomic layer deposition (ALD) or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, sacrificial layers are composed of dielectric materials different from the interlayer dielectric material. In one embodiment, different sacrificial materials may be used in different regions so as to provide different growth or etch selectivity to each other and to the underlying dielectric and metal layers. In some embodiments, a sacrificial layer includes a layer of a nitride of silicon (e.g., silicon nitride) or a layer of an oxide of silicon, or both, or a combination thereof. Other suitable materials may include carbon-based materials. In another embodiment, a sacrificial material includes a metal species. For example, a sacrificial material or other overlying material may include a layer of a nitride of titanium or another metal (e.g., titanium nitride). Potentially lesser amounts of other materials, such as oxygen, may be included in one or more of these layers. Alternatively, other sacrificial layers known in the arts may be used depending upon the particular implementation. The sacrificial layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion lithography (i193), extreme ultra-violet (EUV) and/or electron-beam direct write (EBDW) lithography, directed self-assembly, etc. In other embodiments, the pitch does not need to be constant, nor does the width.

In an embodiment, the term "grating structure" for metal lines, ILD lines or hardmask lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a constant pitch and having a constant width. The pattern may be fabricated by a pitch halving or pitch quartering, or other pitch division, approach.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
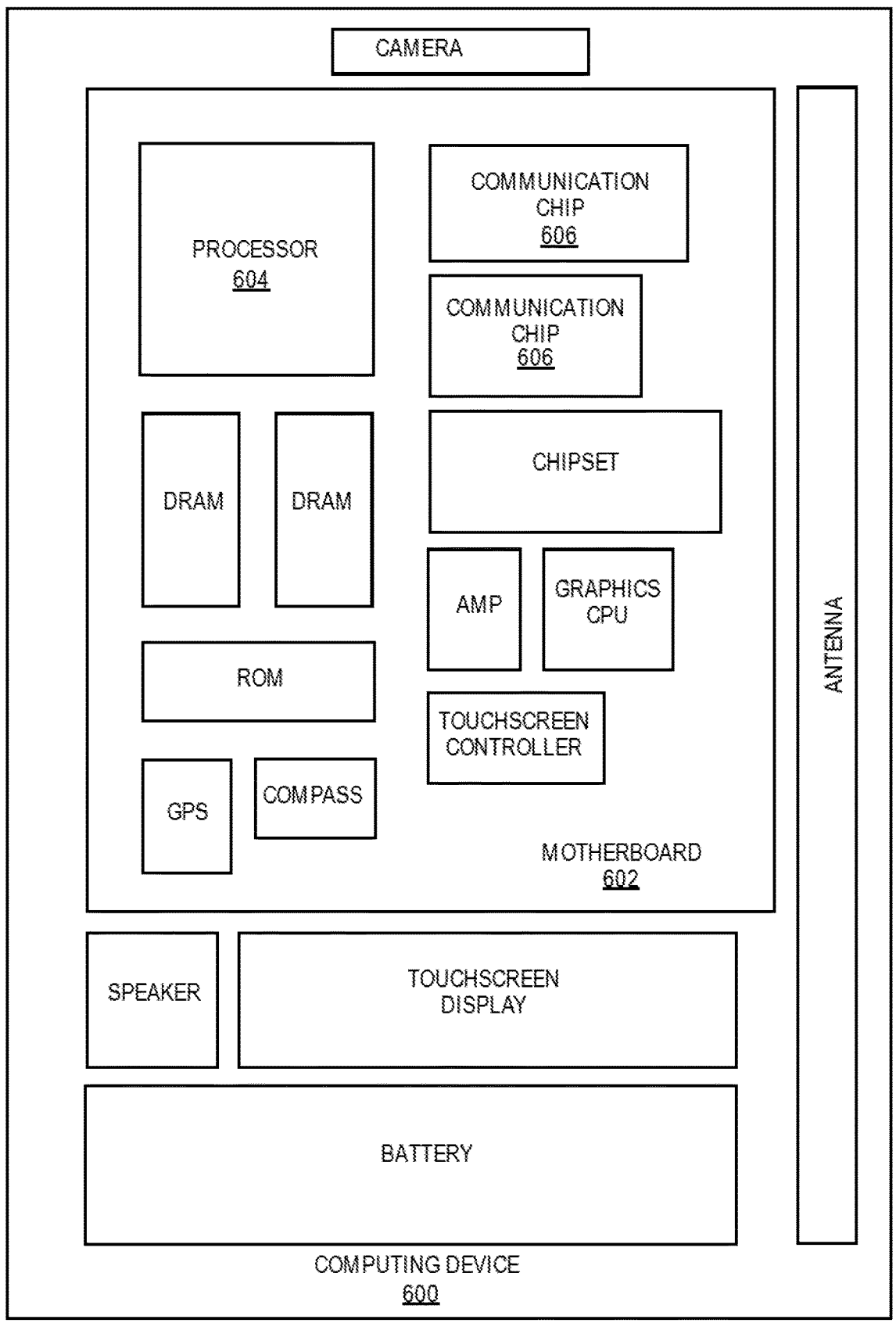
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor includes or is fabricated using topographically-selective ALD processes to replicate grating patterns, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip includes or is fabricated using topographically-selective ALD processes to replicate grating patterns, as described herein.

In further implementations, another component housed within the computing device 600 may contain an integrated circuit die that includes or is fabricated using topographically-selective ALD processes to replicate grating patterns, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
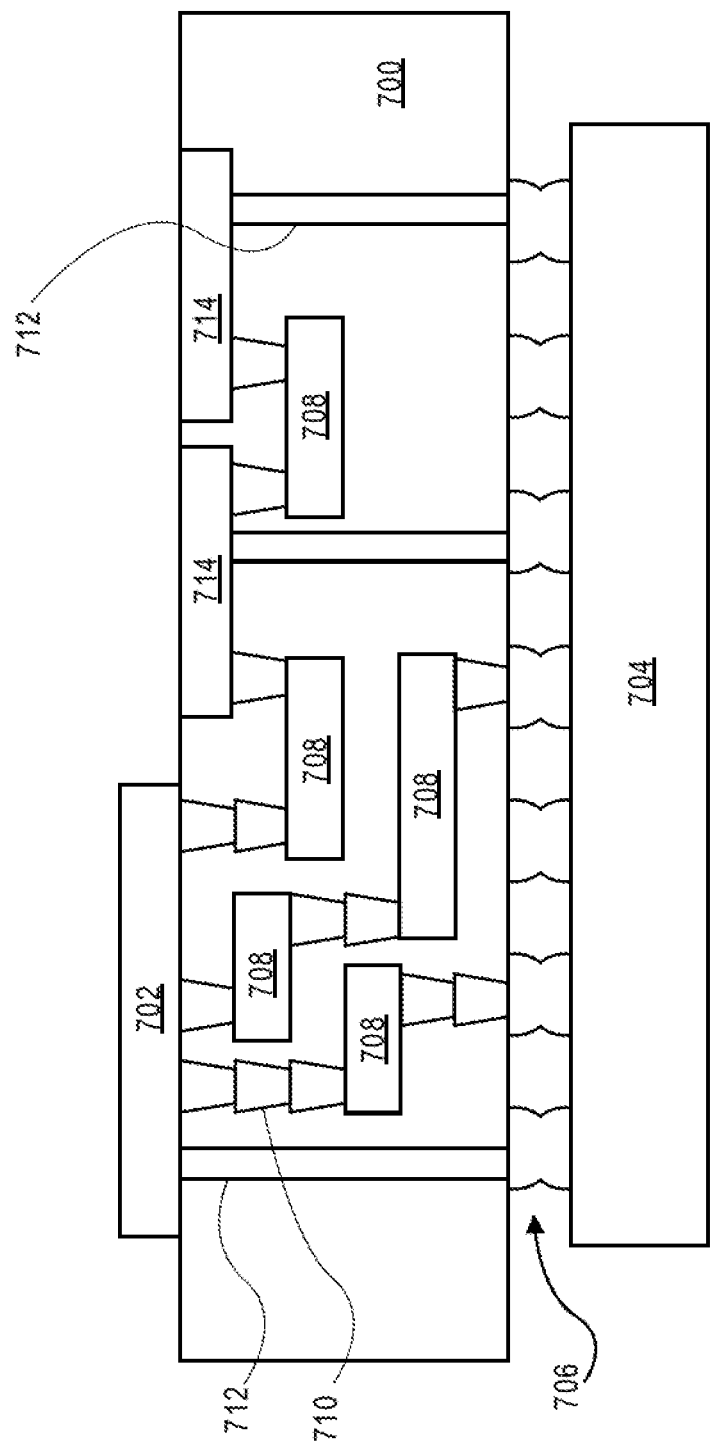
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure include structures using topographically-selective ALD processes to replicate grating patterns, as described herein.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: an interconnect structure, comprising: a first interlayer dielectric (ILD); a first interconnect layer, wherein the first interconnect layer comprises a plurality of first conductive traces, wherein the conductive traces are partially embedded in the first ILD; an etch stop layer over surfaces of the first ILD and sidewall surfaces of the first conductive traces; a second interconnect layer, wherein the second interconnect layer comprises a plurality of second conductive traces; and a via between the first interconnect layer and the second interconnect layer, wherein the via is self-aligned with the first interconnect layer.

Example 2: the interconnect structure of Example 1, wherein the first interconnect layer comprises first conductive traces that do not all have the same width.

Example 3: the interconnect structure of Example 1 or Example 2, wherein the second interconnect layer comprises second conductive traces that do not all have the same width, and wherein aligned pairs of first conductive traces and second conductive traces have substantially the same width.

Example 4: the interconnect structure of Examples 1-3, wherein the first interconnect layer comprises a first pitch and a second pitch, wherein the first pitch is different than the second pitch.

Example 5: the interconnect structure of Examples 1-4, wherein the second interconnect layer comprises a third pitch and a fourth pitch, wherein the third pitch is substantially the same as the first pitch, and wherein the fourth pitch is substantially the same as the second pitch.

Example 6: the interconnect structure of Examples 1-5, wherein the etch stop layer is formed over top surfaces of the first conductive traces.

Example 7: the interconnect structure of Examples 1-6, wherein centerlines of the first conductive traces are substantially aligned with centerlines of the second conductive traces.

Example 8: the interconnect structure of Examples 1-7, further comprising: a plurality of self-aligned vias each connecting a first conductive trace to a second conductive trace.

Example 9: the interconnect structure of Examples 1-8, wherein the first interconnect layer comprises a first grating pattern, wherein the first conductive traces are oriented in a first direction, and wherein the second interconnect layer comprises a second grating pattern, wherein the second conductive traces are oriented in a second direction that is orthogonal to the first direction.

Example 10: the interconnect structure of Examples 1-9, wherein a sidewall of the via is substantially coplanar with sidewalls of the first conductive trace and the second conductive trace.

Example 11: a method of forming an interconnect structure, comprising: disposing a first interconnect layer in a first interlayer dielectric (ILD), wherein the first interconnect layer comprises a plurality of conductive traces; recessing an uppermost surface of the first ILD, wherein the recessed uppermost surface of the first ILD is below uppermost surfaces of the first conductive traces; disposing an etch stop layer over the first ILD and the first conductive traces; and selectively depositing a helmet layer over the first conductive traces, wherein the helmet layer is deposited with an atomic layer deposition (ALD) processes that comprises spinning a substrate on which the interconnect structure is formed.

Example 12: the method of Example 11, further comprising: disposing a second ILD over the interconnect structure, wherein the second ILD fills gaps between the helmet layer.

Example 13: the method of Example 11 or Example 12, further comprising, disposing a first hardmask layer over the second ILD and between the helmet layer.

Example 14: the method of Examples 11-13, further comprising: removing the helmet layer; and disposing a third ILD in the gaps between the second ILD.

Example 15: the method of Examples 11-14, further comprising: disposing a second hardmask layer over the third ILD, wherein the second hardmask layer is aligned with the interconnect layer.

Example 16: the method of Examples 11-15, wherein the plurality of first conductive traces comprise a first pitch and a second pitch, wherein the first pitch is different than the second pitch.

Example 17: a method of forming an interconnect structure, comprising: disposing a first interconnect layer into a first interlayer dielectric (ILD), wherein the first interconnect layer comprises a plurality of first conductive traces; selectively disposing a second ILD over exposed surfaces of the first ILD between the first conductive traces, wherein an uppermost surface of the second ILD is above an uppermost surface of the first conductive traces; and disposing a helmet layer over the second ILD, wherein the helmet layer is deposited with an atomic layer deposition (ALD) processes that comprises spinning a substrate on which the interconnect structure is formed.

Example 18: the method of Example 17, further comprising, disposing a third ILD over the interconnect structure, wherein the third ILD fills gaps between the helmet layer.

Example 19: the method of Example 17 or Example 18, further comprising, disposing a first hardmask layer over the third ILD and between the helmet layer.

Example 20: the method of Examples 17-19, further comprising: removing the helmet layer; and disposing a fourth ILD in the gaps between the third ILD.

Example 21: the method of Examples 17-20, further comprising: disposing a second hardmask layer over the fourth ILD, wherein the second hardmask layer is aligned with the interconnect layer.

Example 22: the method of Examples 17-21, wherein the plurality of first conductive traces comprise a first pitch and a second pitch, wherein the first pitch is different than the second pitch.

Example 23: an electronic system, comprising: a transistor device formed on a semiconductor substrate; a plurality of interlayer dielectrics (ILDs) disposed over the semiconductor substrate; and a plurality of interconnect layers in the plurality of ILDs, wherein each interconnect layer comprises a plurality of conductive traces arranged in a grating pattern, and wherein a first grating pattern in a first interconnect layer is replicated as a second grating pattern in a second interconnect layer, and wherein at least one of the conductive traces is electrically coupled to the transistor device.

Example 24: the electronic system of Example 23, wherein the first grating pattern comprises a first pitch and a second pitch.

Example 25: the electronic system of Example 23 or Example 24, further comprising dielectric helmets disposed between the plurality of conductive traces, wherein the dielectric helmets comprises a non-planar surface.

What is claimed is:

1. An interconnect structure, comprising:
   a first interlayer dielectric (ILD);
   a first interconnect layer, wherein the first interconnect layer comprises a plurality of first conductive traces, wherein the conductive traces are partially embedded in the first ILD;
   an etch stop layer over surfaces of the first ILD and sidewall surfaces of the first conductive traces;
   a second interconnect layer, wherein the second interconnect layer comprises a plurality of second conductive traces; and
   a via between the first interconnect layer and the second interconnect layer, wherein the via is self-aligned with the first interconnect layer.

2. The interconnect structure of claim 1, wherein the first interconnect layer comprises first conductive traces that do not all have the same width.

3. The interconnect structure of claim 2, wherein the second interconnect layer comprises second conductive traces that do not all have the same width, and wherein aligned pairs of first conductive traces and second conductive traces have substantially the same width.

4. The interconnect structure of claim 1, wherein the first interconnect layer comprises a first pitch and a second pitch, wherein the first pitch is different than the second pitch.

5. The interconnect structure of claim 4, wherein the second interconnect layer comprises a third pitch and a fourth pitch, wherein the third pitch is substantially the same as the first pitch, and wherein the fourth pitch is substantially the same as the second pitch.

6. The interconnect structure of claim 1, wherein the etch stop layer is formed over top surfaces of the first conductive traces.

7. The interconnect structure of claim 1, wherein centerlines of the first conductive traces are substantially aligned with centerlines of the second conductive traces.

8. The interconnect structure of claim 1, further comprising:
   a plurality of self-aligned vias each connecting a first conductive trace to a second conductive trace.

9. The interconnect structure of claim 1, wherein the first interconnect layer comprises a first grating pattern, wherein the first conductive traces are oriented in a first direction, and wherein the second interconnect layer comprises a second grating pattern, wherein the second conductive traces are oriented in a second direction that is orthogonal to the first direction.

10. The interconnect structure of claim 9, wherein a sidewall of the via is substantially coplanar with sidewalls of the first conductive trace and the second conductive trace.

* * * * *